United States Patent
Ferrara et al.

(10) Patent No.: US 12,416,710 B1
(45) Date of Patent: Sep. 16, 2025

(54) MANUFACTURING PROCESS FOR LIDAR SYSTEM WITH INDIVIDUALIZED SEMICONDUCTOR OPTICAL AMPLIFIER DIES

(71) Applicant: Aurora Operations, Inc., Pittsburgh, PA (US)

(72) Inventors: James Ferrara, Oakland, CA (US); Pruthvi Jujjavarapu, Palo Alto, CA (US); Sen Lin, Mountain View, CA (US); Andrew Steil Michaels, Los Altos, CA (US); Gevorg Martuni Nahapetian, Pleasanton, CA (US); Parth Panchal, San Jose, CA (US); Imbert Yuyen Wang, Santa Clara, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

(21) Appl. No.: 18/811,327

(22) Filed: Aug. 21, 2024

(51) Int. Cl.
| | |
|---|---|
| *G01S 7/481* | (2006.01) |
| *H01S 5/02* | (2006.01) |
| *H01S 5/02253* | (2021.01) |
| *H01S 5/02375* | (2021.01) |
| *H01S 5/024* | (2006.01) |
| *H01S 5/20* | (2006.01) |
| *H01S 5/343* | (2006.01) |

(52) U.S. Cl.
CPC .......... *G01S 7/4815* (2013.01); *H01S 5/0201* (2013.01); *H01S 5/02253* (2021.01); *H01S 5/02375* (2021.01); *H01S 5/02469* (2013.01); *H01S 5/2018* (2013.01); *H01S 5/343* (2013.01)

(58) Field of Classification Search
CPC .. G01S 7/4815; H01S 5/0201; H01S 5/02253; H01S 5/02375; H01S 5/02469; H01S 5/2018; H01S 5/343
USPC .......................................................... 438/38
See application file for complete search history.

(56) References Cited

U.S. PATENT DOCUMENTS

2021/0270698 A1* 9/2021 Sugiyama .............. G01M 11/33

* cited by examiner

*Primary Examiner* — Caleen O Sullivan
(74) *Attorney, Agent, or Firm* — Dority & Manning, P.A.

(57) ABSTRACT

The present disclosure is directed to a manufacturing process for a LIDAR system with individualized semiconductor optical amplifier (SOA) dies including: (a) forming a plurality of SOA regions on a semiconductor wafer; (b) dicing the semiconductor wafer to produce a plurality of individualized SOA dies, the plurality of individualized SOA dies respectively including the plurality of SOA regions; (c) aligning the plurality of individualized SOA dies with one or more array inputs, the one or more array inputs configured to provide a beam from a light source to the plurality of individualized SOA dies; and (d) aligning the plurality of individualized SOA dies with one or more array outputs, the one or more array outputs configured to provide the beam from the plurality of individual SOA dies to an emitter.

20 Claims, 12 Drawing Sheets

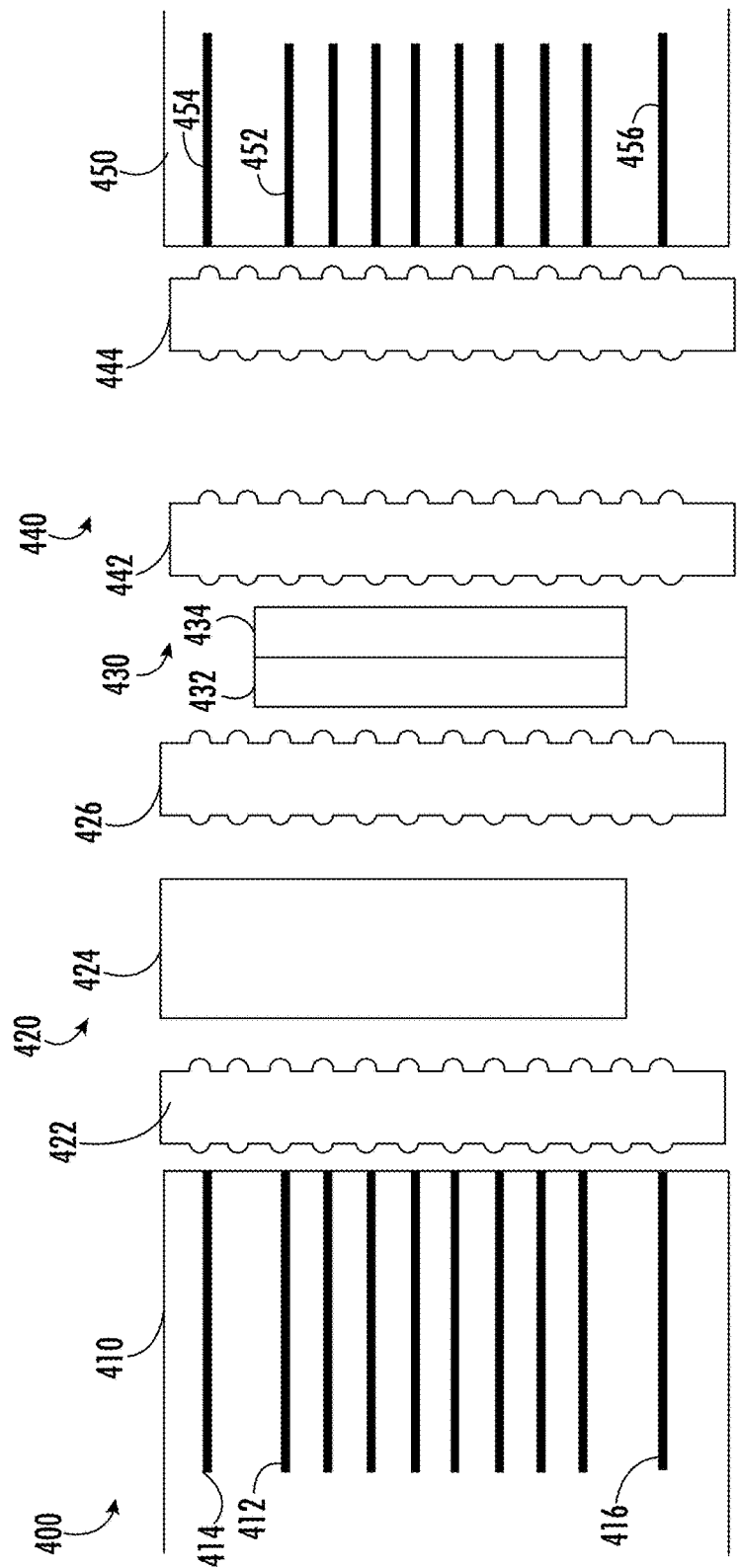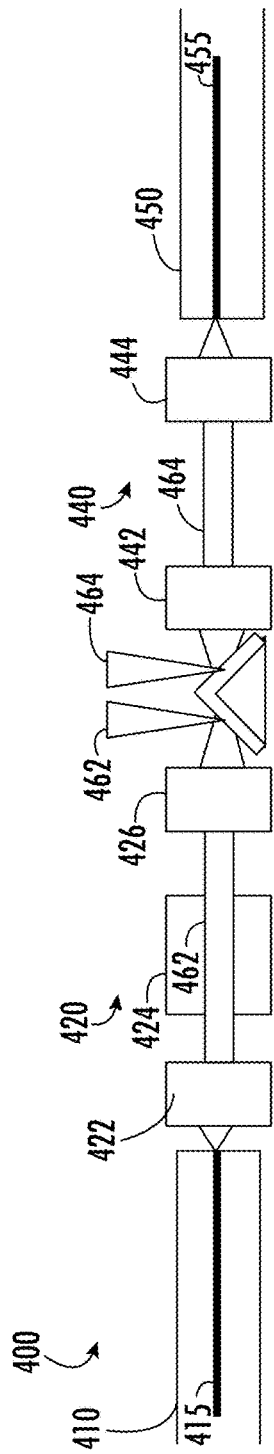
FIG. 4A
FIG. 4B

MANUFACTURING PROCESS FOR LIDAR SYSTEM WITH INDIVIDUALIZED SEMICONDUCTOR OPTICAL AMPLIFIER DIES

BACKGROUND

Light Detection and Ranging (LIDAR) systems use lasers to create three-dimensional representations of surrounding environments. A LIDAR system includes at least one emitter paired with a receiver to form a channel, though an array of channels may be used to expand the field of view of the LIDAR system. During operation, each channel emits a laser beam into the environment. The laser beam reflects off of an object within the surrounding environment, and the reflected laser beam is detected by the receiver. A single channel provides a single point of ranging information. Collectively, channels are combined to create a point cloud that corresponds to a three-dimensional representation of the surrounding environment.

The emitter and/or receiver often includes photonic circuitry formed on a semiconductor substrate such as a silicon die. Silicon photonics dies can provide for precise formation of the photonic circuitry through, for example, photolithography. Other optical components of a LIDAR sensor system may also be formed on semiconductor substrates, while still others are formed on or connected to components made using other semiconductor materials such as, for example, a group III-V semiconductor, gallium arsenide (GaAs), and/or other suitable materials.

SUMMARY

Aspects and advantages of implementations of the present disclosure will be set forth in part in the following description, or may be learned from the description, or may be learned through practice of the implementations.

Example aspects of the present disclosure are directed to LIDAR systems. As further described herein, the LIDAR systems can be used by various devices and platforms (e.g., robotic platforms, etc.) to improve the ability of the devices and platforms to perceive their environment and perform functions in response thereto (e.g., autonomously navigating through the environment).

In particular, the technology of the present disclosure is directed to a manufacturing process for a LIDAR system with individualized semiconductor optical amplifier (SOA) dies. The individualized SOA dies can be spaced apart from one another. For instance, the SOA dies may be mounted and spaced apart on a thermally-dissipative substrate. Individuating the SOA dies can provide for improved coupling of the amplifiers to upstream or downstream components of the LIDAR system, such as a photonics die or optics. Furthermore, the thermal isolation of the SOA channels corresponding to the SOA dies may be improved, thereby reducing thermal crosstalk, improving screening for faults and defects, or improving yield.

A semiconductor wafer is used to manufacture the LIDAR system having individualized SOA dies. To manufacture this LIDAR system, a plurality of SOA regions can be formed on (e.g., a surface) of the semiconductor wafer. For instance, each SOA region can correspond to one or more SOAs, such as an SOA channel. The semiconductor wafer can then be diced to split and isolate the SOA regions from each other. For instance, dicing the semiconductor wafer can produce a plurality of individualized SOA dies. The individualized SOA dies can respectively include the plurality of SOA regions. The SOA dies can then be aligned with one or more inputs or outputs of the LIDAR system to effectuate the SOA dies as amplifiers (e.g., an amplifier array) in a LIDAR system.

One example implementation of this technology is a photonic integrated circuit having a light source coupled to a silicon photonics die. The light source (e.g., a seed laser) directs a beam to a modulator. The modulator is configured to modulate the beam to produce a modulated beam. The modulator can be configured to modulate phase and/or frequency of the light source such that the modulated beam can include a phase-modulated beam and/or a frequency-modulated beam. The modulated beam is provided to an amplifier stage formed of one or more channels, each channel having one or more SOAs. The amplifier stage is configured to amplify the beam to produce an amplified beam. According to example aspects of the present disclosure, the amplifier stage can be or can include an array of semiconductor optical amplifiers formed on a plurality of individualized SOA dies. The amplified beam is emitted at an object, reflected by the object, and received by a receiver chip. A LIDAR system can determine a distance to the object and/or velocity of the object based on the reflected beam.

Systems and methods according to the present disclosure can provide numerous technical effects and benefits. In one aspect, the present disclosure can provide for an improved method of manufacturing a LIDAR system including a plurality of individualized SOA dies. By dicing at least a portion of the individualized SOA dies from a common semiconductor wafer, process uniformity of the individualized SOA dies may be improved. Additionally or alternatively, by forming an SOA array as a plurality of individualized dies, the surface area of the semiconductor wafer may be more efficiently utilized. For instance, the SOA regions of the individualized SOA dies may individually be smaller than a monolithic SOA array having the same number of SOA regions. This can occur because the space between SOA regions in the monolithic SOA array is represented in the SOA regions as-formed on the semiconductor wafer. In contrast, the space between individualized SOA dies may be introduced during assembly of the LIDAR system, providing for the SOA regions to be more densely arranged when formed on the semiconductor wafer.

Additionally or alternatively, the surface area of the individualized SOA dies may be more amenable to being arranged on the semiconductor wafer than a monolithic SOA array. As one example, the surface area of the individualized SOA dies may be more generally square-like (e.g., having closer to equal length and width) than a monolithic SOA array, which may generally be more rectangular (e.g., due to having multiple SOA regions arranged in a linear or other configuration). The surface area of the individualized SOA dies may therefore more readily be arranged to fit within the surface area of the semiconductor wafer, which is generally circular or near-circular. More efficiently utilizing the semiconductor wafer can in turn provide a higher yield of SOA devices from a single semiconductor wafer or less wasted semiconductor wafer from each yield, which can reduce manufacturing costs associated with inefficiencies and improve the throughput of conventional manufacturing facilities.

For example, in an aspect, the present disclosure provides a method for manufacturing a semiconductor device for a LIDAR system for a vehicle. The method includes forming a plurality of semiconductor optical amplifier (SOA) regions on a semiconductor wafer. The method includes dicing the semiconductor wafer to produce a plurality of individualized SOA dies, the plurality of individualized SOA dies respectively including the plurality of SOA regions. The method includes aligning the plurality of individualized SOA dies with one or more array inputs, the one or more array inputs configured to provide a beam from a light source to the plurality of individualized SOA dies. The method includes aligning the plurality of individualized SOA dies with one or more array outputs, the one or more array outputs configured to provide the beam from the plurality of individual SOA dies to an emitter.

In some implementations, dicing the semiconductor wafer produces a plurality of semiconductor dies respective to the individualized SOA dies.

In some implementations, forming the plurality of SOA regions includes forming one or more waveguide layers on the semiconductor wafer; forming one or more spacer layers between the one or more waveguide layers; and forming one or more amplification layers above the one or more waveguide layers.

In some implementations, forming the one or more amplification layers includes forming at least one of an n-doped semiconductor layer, a multiple quantum wells (MQW) layer, a p-doped semiconductor layer, or an insulating layer.

In some implementations, forming the one or more waveguide layers includes forming a waveguide region by the one or more waveguide layers for an individualized SOA die of the plurality of individualized SOA dies. The waveguide region includes: a lateral portion defining an angle about 10 degrees of a lateral dimension of the individualized SOA die; a first angled portion extending from a first end of the lateral portion, the first angled portion defining an angle than about 10 degrees from the lateral dimension of the individualized SOA die; and a second angled portion extending from a second end of the lateral portion, the second angled portion defining an angle greater than about 10 degrees from the lateral dimension of the individualized SOA die.

In some implementations, one of the first angled portion or the second angled portion defines an angle between about 10 degrees from the lateral dimension of the individualized SOA die and about 45 degrees from the lateral dimension of the individualized SOA die.

In some implementations, one or both of aligning the plurality of individualized SOA dies with one or more array inputs or aligning the plurality of individualized SOA dies with one or more array outputs includes aligning the plurality of individualized SOA dies along a first direction and a second direction.

In some implementations, the method further includes coupling the plurality of individualized SOA dies to a thermally conductive substrate.

In some implementations, the thermally conductive substrate is or includes a heat sink.

In some implementations, the method further includes forming one or more butt couplings between at least one of the one or more array inputs or the one or more array outputs and the plurality of individualized SOA dies, the one or more butt couplings being or including a direct coupling between a surface of the plurality of individualized SOA dies and the at least one of the one or more array inputs or the one or more array outputs.

In some implementations, the method further includes providing one or more microlenses at one or both of the one or more array inputs and the one or more array outputs, the one or more microlenses configured to focus the beam passing through the plurality of individualized SOA dies.

In some implementations, the individualized SOA dies are aligned such that a lateral dimension of the individualized SOA dies is angled greater than about 10 degrees from a length dimension defined by the LIDAR system.

For example, in an aspect, the present disclosure provides a system for manufacturing a semiconductor device for a LIDAR system for a vehicle. The system is operable to form a plurality of semiconductor optical amplifier (SOA) regions on a semiconductor wafer. The system is operable to dice the semiconductor wafer to produce a plurality of individualized SOA dies, the plurality of individualized SOA dies respectively including the plurality of SOA regions. The system is operable to align the plurality of individualized SOA dies with one or more array inputs, the one or more array inputs configured to provide a beam from a light source to the plurality of individualized SOA dies. The system is operable to align the plurality of individualized SOA dies with one or more array outputs, the one or more array outputs configured to provide the beam from the plurality of individual SOA dies to an emitter.

In some implementations, dicing the semiconductor wafer produces a plurality of semiconductor dies respectively including the individualized SOA dies.

In some implementations, forming the plurality of SOA regions includes forming one or more waveguide layers on the semiconductor wafer; forming one or more spacer layers between the one or more waveguide layers; and forming one or more amplification layers above the one or more waveguide layers.

In some implementations, forming the one or more amplification layers includes forming at least one of an n-doped semiconductor layer, a multiple quantum wells (MQW) layer, a p-doped semiconductor layer, or an insulating layer.

In some implementations, forming the one or more waveguide layers includes forming a waveguide region by the one or more waveguide layers for an individualized SOA die of the plurality of individualized SOA dies. The waveguide region includes: a lateral portion defining an angle about 10 degrees of a lateral dimension of the individualized SOA die; a first angled portion extending from a first end of the lateral portion, the first angled portion defining an angle than about 10 degrees from the lateral dimension of the individualized SOA die; and a second angled portion extending from a second end of the lateral portion, the second angled portion defining an angle greater than about 10 degrees from the lateral dimension of the individualized SOA die.

In some implementations, one of the first angled portion or the second angled portion is angled between about 10 degrees from the lateral dimension of the individualized SOA die and about 45 degrees from the lateral dimension of the individualized SOA die.

In some implementations, one or both of aligning the plurality of individualized SOA dies with one or more array inputs or aligning the plurality of individualized SOA dies with one or more array outputs includes aligning the plurality of individualized SOA dies along a first direction and a second direction.

For example, in an aspect, the present disclosure provides a method for manufacturing a LIDAR system for a vehicle. The method includes forming a plurality of semiconductor optical amplifier (SOA) regions on a semiconductor wafer. The method includes dicing the semiconductor wafer to produce a plurality of individualized SOA dies, the plurality of individualized SOA dies respectively including the plurality of SOA regions. The method includes aligning the plurality of individualized SOA dies with one or more array inputs. The method includes aligning the plurality of individualized SOA dies with one or more array outputs. The method includes coupling a light source to the one or more array inputs. The method includes coupling one or more coherent pixels to the one or more array outputs.

Other example aspects of the present disclosure are directed to other systems, methods, apparatuses, tangible non-transitory computer-readable media, and devices for manufacturing semiconductor devices for a LIDAR system, as well as motion prediction and/or operation of a device (e.g., a vehicle) including a LIDAR system having a LIDAR module with one or more semiconductor devices according to example aspects of the present disclosure.

These and other features, aspects and advantages of various implementations of the present disclosure will become better understood with reference to the following description and appended claims. The accompanying drawings, which are incorporated in and constitute a part of this specification, illustrate implementations of the present disclosure and, together with the description, serve to explain the related principles.

BRIEF DESCRIPTION OF THE DRAWINGS

FIGS. 4A-4B depict an example transceiver according to some implementations of the present disclosure.

DETAILED DESCRIPTION

The following describes the technology of this disclosure within the context of an autonomous vehicle for example purposes only. As described herein, the technology is not limited to an autonomous vehicle and can be implemented within other robotic and computing systems as well as various devices. For example, the systems and methods disclosed herein can be implemented in a variety of ways including, but not limited to, a computer-implemented method, an autonomous vehicle system, an autonomous vehicle control system, a robotic platform system, a general robotic device control system, a computing device, etc.

Figure 1:
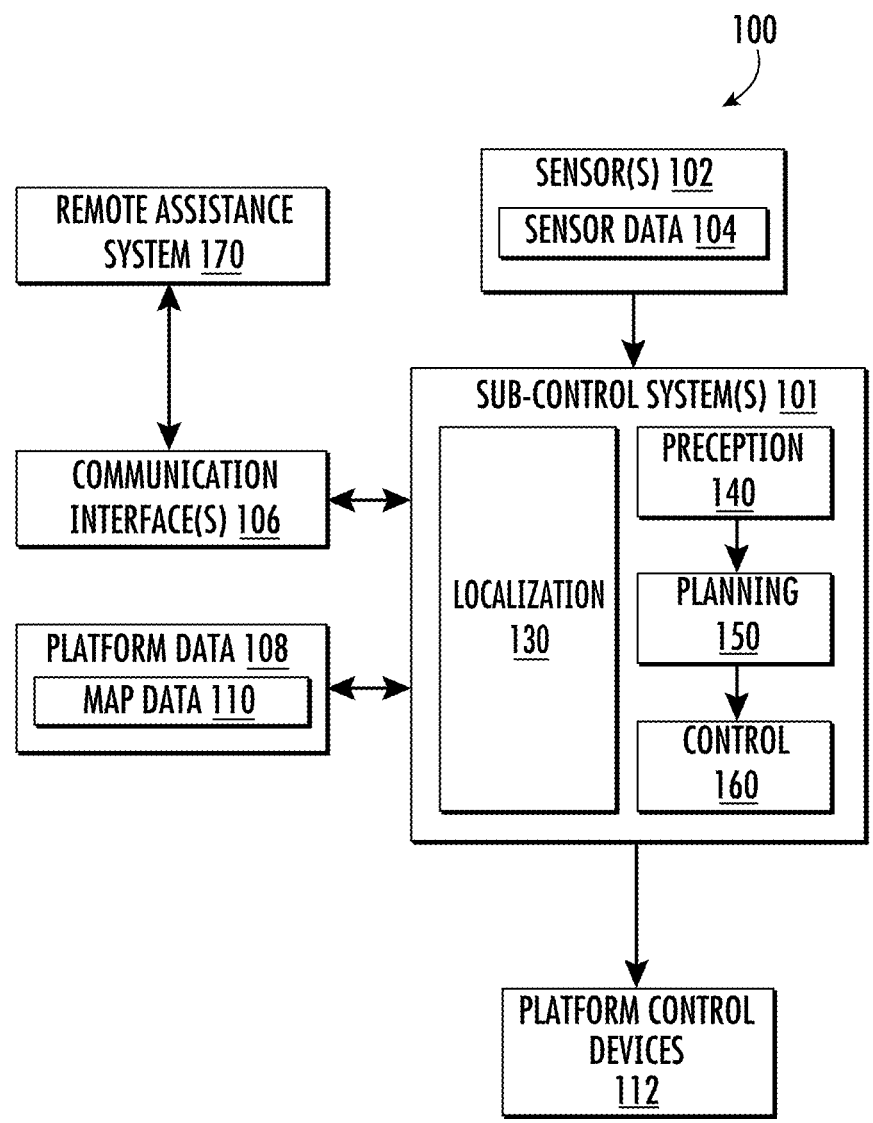
FIG. 1 depicts a block diagram of an example system according to some implementations of the present disclosure.

With reference to FIGS. 1-10C, example implementations of the present disclosure are discussed in further detail. FIG. 1 depicts a block diagram of an example autonomous vehicle control system 100 for an autonomous vehicle according to some implementations of the present disclosure. The autonomous vehicle control system 100 can be implemented by a computing system of an autonomous vehicle). The autonomous vehicle control system 100 can include one or more sub-control systems 101 that operate to obtain inputs from sensor(s) 102 or other input devices of the autonomous vehicle control system 100. In some implementations, the sub-control system(s) 101 can additionally obtain platform data 108 (e.g., map data 110) from local or remote storage. The sub-control system(s) 101 can generate control outputs for controlling the autonomous vehicle (e.g., through platform control devices 112, etc.) based on sensor data 104, map data 110, or other data. The sub-control system 101 may include different subsystems for performing various autonomy operations. The subsystems may include a localization system 130, a perception system 140, a planning system 150, and a control system 160. The localization system 130 can determine the location of the autonomous vehicle within its environment; the perception system 140 can detect, classify, and track objects and actors in the environment; the planning system 150 can determine a trajectory for the autonomous vehicle; and the control system 160 can translate the trajectory into vehicle controls for controlling the autonomous vehicle. The sub-control system(s) 101 can be implemented by one or more onboard computing system(s). The subsystems can include one or more processors and one or more memory devices. The one or more memory devices can store instructions executable by the one or more processors to cause the one or more processors to perform operations or functions associated with the subsystems. The computing resources of the sub-control system(s) 101 can be shared among its subsystems, or a subsystem can have a set of dedicated computing resources.

In some implementations, the autonomous vehicle control system 100 can be implemented for or by an autonomous vehicle (e.g., a ground-based autonomous vehicle). The autonomous vehicle control system 100 can perform various processing techniques on inputs (e.g., the sensor data 104, the map data 110) to perceive and understand the vehicle's surrounding environment and generate an appropriate set of control outputs to implement a vehicle motion plan (e.g., including one or more trajectories) for traversing the vehicle's surrounding environment. In some implementations, an autonomous vehicle implementing the autonomous vehicle control system 100 can drive, navigate, operate, etc. with minimal or no interaction from a human operator (e.g., driver, pilot, etc.).

In some implementations, the autonomous vehicle can be configured to operate in a plurality of operating modes. For instance, the autonomous vehicle can be configured to operate in a fully autonomous (e.g., self-driving, etc.) operating mode in which the autonomous platform is controllable without user input (e.g., can drive and navigate with no input from a human operator present in the autonomous vehicle or remote from the autonomous vehicle, etc.). The autonomous vehicle can operate in a semi-autonomous operating mode in which the autonomous vehicle can operate with some input from a human operator present in the autonomous vehicle (or a human operator that is remote from the autonomous platform). In some implementations, the autonomous vehicle can enter into a manual operating mode in which the autonomous vehicle is fully controllable by a human operator (e.g., human driver, etc.) and can be prohibited or disabled (e.g., temporary, permanently, etc.) from performing autonomous navigation (e.g., autonomous driving, etc.). The autonomous vehicle can be configured to operate in other modes such as, for example, park or sleep modes (e.g., for use between tasks such as waiting to provide a trip/service, recharging, etc.). In some implementations, the autonomous vehicle can implement vehicle operating assistance technology (e.g., collision mitigation system, power assist steering, etc.), for example, to help assist the human operator of the autonomous platform (e.g., while in a manual mode, etc.).

The autonomous vehicle control system 100 can be located onboard (e.g., on or within) an autonomous vehicle and can be configured to operate the autonomous vehicle in various environments. The environment may be a real-world environment or a simulated environment. In some implementations, one or more simulation computing devices can simulate one or more of: the sensors 102, the sensor data 104, communication interface(s) 106, the platform data 108, or the platform control devices 112 for simulating operation of the autonomous vehicle control system 100.

In some implementations, the sub-control system(s) 101 can communicate with one or more networks or other systems with communication interface(s) 106. The communication interface(s) 106 can include any suitable components for interfacing with one or more network(s), including, for example, transmitters, receivers, ports, controllers, antennas, or other suitable components that can help facilitate communication. In some implementations, the communication interface(s) 106 can include a plurality of components (e.g., antennas, transmitters, or receivers, etc.) that allow it to implement and utilize various communication techniques (e.g., multiple-input, multiple-output (MIMO) technology, etc.).

In some implementations, the sub-control system(s) 101 can use the communication interface(s) 106 to communicate with one or more computing devices that are remote from the autonomous vehicle over one or more network(s). For instance, in some examples, one or more inputs, data, or functionalities of the sub-control system(s) 101 can be supplemented or substituted by a remote system communicating over the communication interface(s) 106. For instance, in some implementations, the map data 110 can be downloaded over a network to a remote system using the communication interface(s) 106. In some examples, one or more of the localization system 130, the perception system 140, the planning system 150, or the control system 160 can be updated, influenced, nudged, communicated with, etc. by a remote system for assistance, maintenance, situational response override, management, etc.

The sensor(s) 102 can be located onboard the autonomous platform. In some implementations, the sensor(s) 102 can include one or more types of sensor(s). For instance, one or more sensors can include image capturing device(s) (e.g., visible spectrum cameras, infrared cameras, etc.). Additionally or alternatively, the sensor(s) 102 can include one or more depth capturing device(s). For example, the sensor(s) 102 can include one or more LIDAR sensor(s) or Radio Detection and Ranging (RADAR) sensor(s). The sensor(s) 102 can be configured to generate point data descriptive of at least a portion of a three-hundred-and-sixty-degree view of the surrounding environment. The point data can be point cloud data (e.g., three-dimensional LIDAR point cloud data, RADAR point cloud data). In some implementations, one or more of the sensor(s) 102 for capturing depth information can be fixed to a rotational device in order to rotate the sensor(s) 102 about an axis. The sensor(s) 102 can be rotated about the axis while capturing data in interval sector packets descriptive of different portions of a three-hundred-and-sixty-degree view of a surrounding environment of the autonomous platform. In some implementations, one or more of the sensor(s) 102 for capturing depth information can be solid state.

The sensor(s) 102 can be configured to capture the sensor data 104 indicating or otherwise being associated with at least a portion of the environment of the autonomous vehicle. The sensor data 104 can include image data (e.g., 2D camera data, video data, etc.), RADAR data, LIDAR data (e.g., 3D point cloud data, etc.), audio data, or other types of data. In some implementations, the sub-control system(s) 101 can obtain input from additional types of sensors, such as inertial measurement units (IMUs), altimeters, inclinometers, odometry devices, location or positioning devices (e.g., GPS, compass), wheel encoders, or other types of sensors. In some implementations, the sub-control system(s) 101 can obtain sensor data 104 associated with particular component(s) or system(s) of the autonomous vehicle. This sensor data 104 can indicate, for example, wheel speed, component temperatures, steering angle, cargo or passenger status, etc. In some implementations, the sub-control system(s) 101 can obtain sensor data 104 associated with ambient conditions, such as environmental or weather conditions. In some implementations, the sensor data 104 can include multi-modal sensor data. The multi-modal sensor data can be obtained by at least two different types of sensor(s) (e.g., of the sensors 102) and can indicate static and/or dynamic object(s) or actor(s) within an environment of the autonomous vehicle. The multi-modal sensor data can include at least two types of sensor data (e.g., camera and LIDAR data). In some implementations, the autonomous vehicle can utilize the sensor data 104 for sensors that are remote from (e.g., offboard) the autonomous vehicle. This can include for example, sensor data 104 captured by a different autonomous vehicle.

The sub-control system(s) 101 can obtain the map data 110 associated with an environment in which the autonomous vehicle was, is, or will be located. The map data 110 can provide information about an environment or a geographic area. For example, the map data 110 can provide information regarding the identity and location of different travel ways (e.g., roadways, etc.), travel way segments (e.g., road segments, etc.), buildings, or other items or objects (e.g., lampposts, crosswalks, curbs, etc.); the location and directions of boundaries or boundary markings (e.g., the location and direction of traffic lanes, parking lanes, turning lanes, bicycle lanes, other lanes, etc.); traffic control data (e.g., the location and instructions of signage, traffic lights, other traffic control devices, etc.); obstruction information (e.g., temporary or permanent blockages, etc.); event data (e.g., road closures/traffic rule alterations due to parades, concerts, sporting events, etc.); nominal vehicle path data (e.g., indicating an ideal vehicle path such as along the center of a certain lane, etc.); or any other map data that provides information that assists an autonomous vehicle in understanding its surrounding environment and its relationship thereto. In some implementations, the map data 110 can include high-definition map information. Additionally or alternatively, the map data 110 can include sparse map data (e.g., lane graphs, etc.). In some implementations, the sensor data 104 can be fused with or used to update the map data 110 in real time.

The sub-control system(s) 101 can include the localization system 130, which can provide an autonomous vehicle with an understanding of its location and orientation in an environment. In some examples, the localization system 130 can support one or more other subsystems of the sub-control system(s) 101, such as by providing a unified local reference frame for performing, e.g., perception operations, planning operations, or control operations.

In some implementations, the localization system 130 can determine a current position of the autonomous vehicle. A current position can include a global position (e.g., respecting a georeferenced anchor, etc.) or relative position (e.g., respecting objects in the environment, etc.). The localization system 130 can generally include or interface with any device or circuitry for analyzing a position or change in position of an autonomous vehicle. For example, the localization system 130 can determine position by using one or more of: inertial sensors (e.g., inertial measurement unit(s), etc.), a satellite positioning system, radio receivers, networking devices (e.g., based on IP address, etc.), triangulation or proximity to network access points or other network components (e.g., cellular towers, Wi-Fi access points, etc.), or other suitable techniques. The position of the autonomous vehicle can be used by various subsystems of the sub-control system(s) 101 or provided to a remote computing system (e.g., using the communication interface(s) 106).

In some implementations, the localization system 130 can register relative positions of elements of a surrounding environment of the autonomous vehicle with recorded positions in the map data 110. For instance, the localization system 130 can process the sensor data 104 (e.g., LIDAR data, RADAR data, camera data, etc.) for aligning or otherwise registering to a map of the surrounding environment (e.g., from the map data 110) to understand the autonomous vehicle's position within that environment. Accordingly, in some implementations, the autonomous vehicle can identify its position within the surrounding environment (e.g., across six axes, etc.) based on a search over the map data 110. In some implementations, given an initial location, the localization system 130 can update the autonomous vehicle's location with incremental re-alignment based on recorded or estimated deviations from the initial location. In some implementations, a position can be registered directly within the map data 110.

In some implementations, the map data 110 can include a large volume of data subdivided into geographic tiles, such that a desired region of a map stored in the map data 110 can be reconstructed from one or more tiles. For instance, a plurality of tiles selected from the map data 110 can be stitched together by the sub-control system 101 based on a position obtained by the localization system 130 (e.g., a number of tiles selected in the vicinity of the position).

In some implementations, the localization system 130 can determine positions (e.g., relative or absolute) of one or more attachments or accessories for an autonomous vehicle. For instance, an autonomous vehicle can be associated with a cargo platform, and the localization system 130 can provide positions of one or more points on the cargo platform. For example, a cargo platform can include a trailer or other device towed or otherwise attached to or manipulated by an autonomous vehicle, and the localization system 130 can provide for data describing the position (e.g., absolute, relative, etc.) of the autonomous vehicle as well as the cargo platform. Such information can be obtained by the other autonomy systems to help operate the autonomous vehicle.

The sub-control system(s) 101 can include the perception system 140, which can allow an autonomous platform to detect, classify, and track objects and actors in its environment. Environmental features or objects perceived within an environment can be those within the field of view of the sensor(s) 102 or predicted to be occluded from the sensor(s) 102. This can include object(s) not in motion or not predicted to move (static objects) or object(s) in motion or predicted to be in motion (dynamic objects/actors).

The perception system 140 can determine one or more states (e.g., current or past state(s), etc.) of one or more objects that are within a surrounding environment of an autonomous vehicle. For example, state(s) can describe (e.g., for a given time, time period, etc.) an estimate of an object's current or past location (also referred to as position); current or past speed/velocity; current or past acceleration; current or past heading; current or past orientation; size/footprint (e.g., as represented by a bounding shape, object highlighting, etc.); classification (e.g., pedestrian class vs. vehicle class vs. bicycle class, etc.); the uncertainties associated therewith; or other state information. In some implementations, the perception system 140 can determine the state(s) using one or more algorithms or machine-learned models configured to identify/classify objects based on inputs from the sensor(s) 102. The perception system can use different modalities of the sensor data 104 to generate a representation of the environment to be processed by the one or more algorithms or machine-learned models. In some implementations, state(s) for one or more identified or unidentified objects can be maintained and updated over time as the autonomous vehicle continues to perceive or interact with the objects (e.g., maneuver with or around, yield to, etc.). In this manner, the perception system 140 can provide an understanding about a current state of an environment (e.g., including the objects therein, etc.) informed by a record of prior states of the environment (e.g., including movement histories for the objects therein). Such information can be helpful as the autonomous vehicle plans its motion through the environment.

The sub-control system(s) 101 can include the planning system 150, which can be configured to determine how the autonomous platform is to interact with and move within its environment. The planning system 150 can determine one or more motion plans for an autonomous platform. A motion plan can include one or more trajectories (e.g., motion trajectories) that indicate a path for an autonomous vehicle to follow. A trajectory can be of a certain length or time range. The length or time range can be defined by the computational planning horizon of the planning system 150. A motion trajectory can be defined by one or more waypoints (with associated coordinates). The waypoint(s) can be future location(s) for the autonomous platform. The motion plans can be continuously generated, updated, and considered by the planning system 150.

The planning system 150 can determine a strategy for the autonomous platform. A strategy may be a set of discrete decisions (e.g., yield to actor, reverse yield to actor, merge, lane change) that the autonomous platform makes. The strategy may be selected from a plurality of potential strategies. The selected strategy may be a lowest cost strategy as determined by one or more cost functions. The cost functions may, for example, evaluate the probability of a collision with another actor or object.

The planning system 150 can determine a desired trajectory for executing a strategy. For instance, the planning system 150 can obtain one or more trajectories for executing one or more strategies. The planning system 150 can evaluate trajectories or strategies (e.g., with scores, costs, rewards, constraints, etc.) and rank them. For instance, the planning system 150 can use forecasting output(s) that indicate interactions (e.g., proximity, intersections, etc.) between trajectories for the autonomous platform and one or more objects to inform the evaluation of candidate trajectories or strategies for the autonomous platform. In some implementations, the planning system 150 can utilize static cost(s) to evaluate trajectories for the autonomous platform (e.g., "avoid lane boundaries," "minimize jerk," etc.). Additionally or alternatively, the planning system 150 can utilize dynamic cost(s) to evaluate the trajectories or strategies for the autonomous platform based on forecasted outcomes for the current operational scenario (e.g., forecasted trajectories or strategies leading to interactions between actors, forecasted trajectories or strategies leading to interactions between actors and the autonomous platform, etc.). The planning system 150 can rank trajectories based on one or more static costs, one or more dynamic costs, or a combination thereof. The planning system 150 can select a motion plan (and a corresponding trajectory) based on a ranking of a plurality of candidate trajectories. In some implementations, the planning system 150 can select a highest ranked candidate, or a highest ranked feasible candidate.

The planning system 150 can then validate the selected trajectory against one or more constraints before the trajectory is executed by the autonomous platform.

To help with its motion planning decisions, the planning system 150 can be configured to perform a forecasting function. The planning system 150 can forecast future state(s) of the environment. This can include forecasting the future state(s) of other actors in the environment. In some implementations, the planning system 150 can forecast future state(s) based on current or past state(s) (e.g., as developed or maintained by the perception system 140). In some implementations, future state(s) can be or include forecasted trajectories (e.g., positions over time) of the objects in the environment, such as other actors. In some implementations, one or more of the future state(s) can include one or more probabilities associated therewith (e.g., marginal probabilities, conditional probabilities). For example, the one or more probabilities can include one or more probabilities conditioned on the strategy or trajectory options available to the autonomous vehicle. Additionally or alternatively, the probabilities can include probabilities conditioned on trajectory options available to one or more other actors.

To implement selected motion plan(s), the sub-control system(s) 101 can include a control system 160 (e.g., a vehicle control system). Generally, the control system 160 can provide an interface between the sub-control system(s) 101 and the platform control devices 112 for implementing the strategies and motion plan(s) generated by the planning system 150. For instance, the control system 160 can implement the selected motion plan/trajectory to control the autonomous platform's motion through its environment by following the selected trajectory (e.g., the waypoints included therein). The control system 160 can, for example, translate a motion plan into instructions for the appropriate platform control devices 112 (e.g., acceleration control, brake control, steering control, etc.). By way of example, the control system 160 can translate a selected motion plan into instructions to adjust a steering component (e.g., a steering angle) by a certain number of degrees, apply a certain magnitude of braking force, increase/decrease speed, etc. In some implementations, the control system 160 can communicate with the platform control devices 112 through communication channels including, for example, one or more data buses (e.g., controller area network (CAN), etc.), onboard diagnostics connectors (e.g., OBD-II, etc.), or a combination of wired or wireless communication links. The platform control devices 112 can send or obtain data, messages, signals, etc. to or from the sub-control system(s) 101 (or vice versa) through the communication channel(s).

The sub-control system(s) 101 can receive, through communication interface(s) 106, assistive signal(s) from remote assistance system 170. Remote assistance system 170 can communicate with the sub-control system(s) 101 over a network. In some implementations, the sub-control system(s) 101 can initiate a communication session with the remote assistance system 170. For example, the sub-control system(s) 101 can initiate a session based on or in response to a trigger. In some implementations, the trigger may be an alert, an error signal, a map feature, a request, a location, a traffic condition, a road condition, etc.

After initiating the session, the sub-control system(s) 101 can provide context data to the remote assistance system 170. The context data may include sensor data 104 and state data of the autonomous vehicle. For example, the context data may include a live camera feed from a camera of the autonomous vehicle and the autonomous vehicle's current speed. An operator (e.g., human operator) of the remote assistance system 170 can use the context data to select assistive signals. The assistive signal(s) can provide values or adjustments for various operational parameters or characteristics for the sub-control system(s) 101. For instance, the assistive signal(s) can include way points (e.g., a path around an obstacle, lane change, etc.), velocity or acceleration profiles (e.g., speed limits, etc.), relative motion instructions (e.g., convoy formation, etc.), operational characteristics (e.g., use of auxiliary systems, reduced energy processing modes, etc.), or other signals to assist the sub-control system(s) 101.

The sub-control system(s) 101 can use the assistive signal(s) for input into one or more autonomy subsystems for performing autonomy functions. For instance, the planning system 150 can receive the assistive signal(s) as an input for generating a motion plan. For example, assistive signal(s) can include constraints for generating a motion plan. Additionally or alternatively, assistive signal(s) can include cost or reward adjustments for influencing motion planning by the planning system 150. Additionally or alternatively, assistive signal(s) can be considered by the sub-control system(s) 101 as suggestive inputs for consideration in addition to other received data (e.g., sensor inputs, etc.).

The sub-control system(s) 101 may be platform agnostic, and the control system 160 can provide control instructions to platform control devices 112 for a variety of different platforms for autonomous movement (e.g., a plurality of different autonomous platforms fitted with autonomous control systems). This can include a variety of different types of autonomous vehicles (e.g., sedans, vans, SUVs, trucks, electric vehicles, combustion power vehicles, etc.) from a variety of different manufacturers/developers that operate in various different environments and, in some implementations, perform one or more vehicle services.

Figure 2:
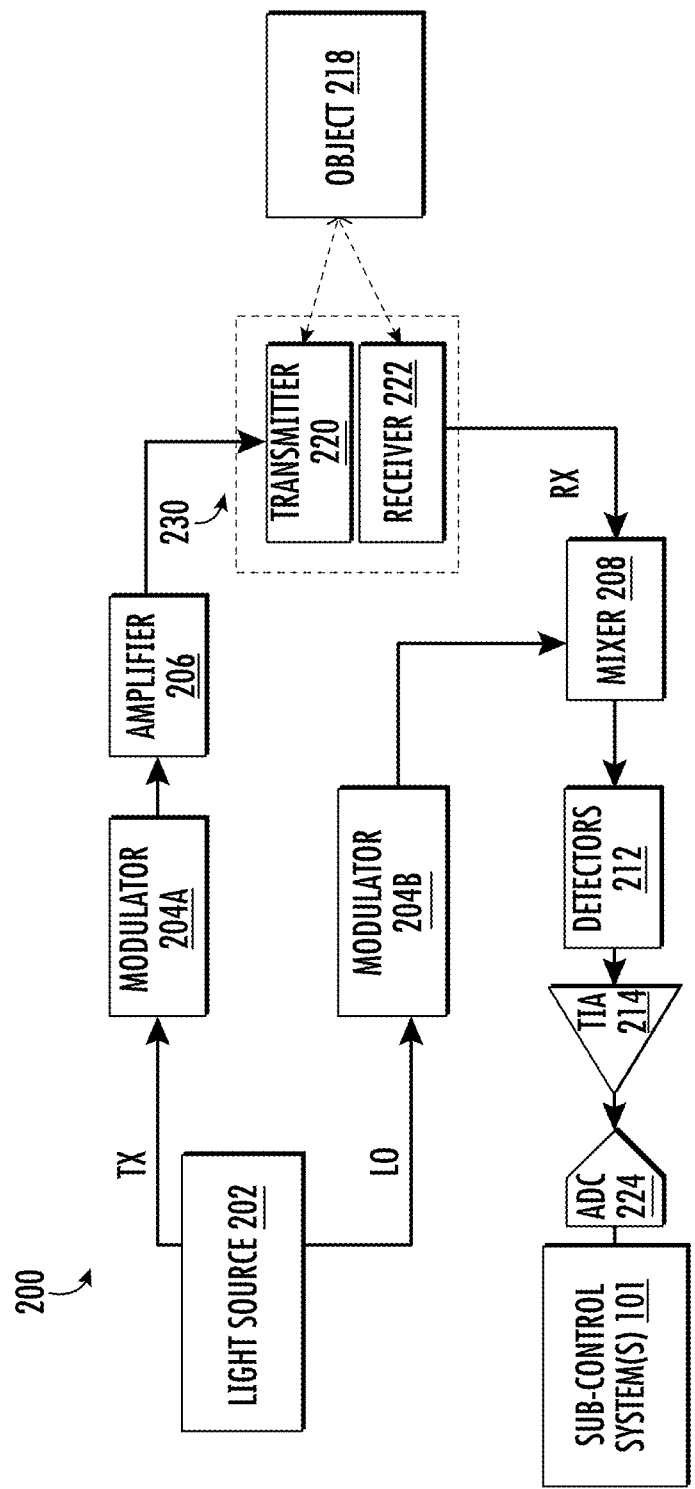
FIG. 2 depicts a block diagram of an example LIDAR system according to some implementations of the present disclosure.

FIG. 2 is a block diagram illustrating an example LIDAR system for autonomous vehicles, according to some implementations. The environment includes a LIDAR system 200 that includes a transmit (Tx) path and a receive (Rx) path. The Tx path includes one or more Tx input/output ports (e.g., channels), and the Rx path includes one or more Rx input/output ports (e.g., channels). In some implementations, a semiconductor substrate and/or semiconductor package may include the Tx path and/or the Rx path. In some implementations, the semiconductor substrate and/or semiconductor package may include at least one of silicon photonics circuitry, programmable logic controller (PLC), or group III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/ placed) along one or more edges of one or more semiconductor substrates and/or semiconductor packages.

The LIDAR system 200 can be coupled to one or more sub-control system(s) 101 (e.g., the sub-control system(s) 101 of FIG. 1). In some implementations, the sub-control system(s) 101 may be coupled to the Rx path via the one or more Rx input/output ports. For instance, the sub-control system(s) 101 can receive LIDAR outputs from the LIDAR system 200. The sub-control system(s) 101 can control a vehicle (e.g., an autonomous vehicle) based on the LIDAR outputs.

The Tx path may include a light source (e.g., light source) 202, a modulator 204A, a modulator 204B, an amplifier 206, and one or more transmitters 220. The Rx path may include one or more receivers 222, a mixer 208, a detector 212, a transimpedance amplifier (TIA) 214, and one or more analog-to-digital converters (ADCs) 224. Although FIG. 2 shows only a select number of components and only one input/output channel, the LIDAR system 200 may include any number of components and/or input/output channels (in any combination) that are interconnected in any arrangement to facilitate combining multiple functions of a LIDAR system, to support the operation of a vehicle.

The light source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The light source 202 may be configured to provide the light signal to the modulator 204A, which is configured to modulate a phase and/or a frequency of the light signal based on a first radio frequency (RF) signal (e.g., an "RF1" signal) to generate a modulated light signal, such as by Continuous Wave (CW) modulation or quasi-CW modulation. The modulator 204A may be configured to send the modulated light signal to the amplifier 206. The amplifier 206 may be configured to amplify the modulated light signal to generate an amplified light signal for transmission via the one or more transmitters 220. The one or more transmitters 220 may include one or more optical waveguides or antennas. In some implementations, modulator 204A and/or modulator 204B may have a bandwidth between 400 megahertz (MHz) and 1000 (MHz).

The LIDAR system 200 includes one or more transmitters 220 and one or more receivers 222. The transmitter(s) 220 and/or receiver(s) 222 can be included in a transceiver 230. The transmitter(s) 220 can provide the transmit beam that it receives from the Tx path into an environment within a given field of view toward an object 218. The one or more receivers 222 can receive a received beam reflected from the object 218 and provide the received beam to the mixer 208 of the Rx path. The one or more receivers 222 may include one or more optical waveguides or antennas. In some arrangements, the one or more transceivers 230 may include a monostatic transceiver or a bistatic transceiver.

The light source 202 may be configured to provide the LO signal to the modulator 204B, which is configured to modulate a phase and/or a frequency of the LO signal based on a second RF signal (e.g., an "RF2" signal) to generate a modulated LO signal (e.g., using Continuous Wave (CW) modulation or quasi-CW modulation) and send the modulated LO signal to the mixer 208 of the Rx path. The mixer 208 may be configured to mix (e.g., combine, multiply, etc.) the modulated LO signal with the returned signal to generate a down-converted signal and send the down-converted signal to the detector 212.

In some arrangements, the mixer 208 may be configured to send the modulated LO signal to the detector 212. The detector 212 may be configured to generate an electrical signal based on the down-converted signal and send the electrical signal to the TIA 214. In some arrangements, the detector 212 may be configured to generate an electrical signal based on the down-converted signal and the modulated signal. The TIA 214 may be configured to amplify the electrical signal and send the amplified electrical signal to the sub-control system(s) 101 via the one or more ADCs 224. In some implementations, the TIA 214 may have a peak noise-equivalent power (NEP) that is less than 5 picowatts per square root Hertz (i.e., 5×10-12 Watts per square root Hertz). In some implementations, the TIA 214 may have a gain between 4 kiloohms and 25 kiloohms. In some implementations, detector 212 and/or TIA 214 may have a 3-decibel bandwidth between 80 kilohertz (kHz) and 450 megahertz (MHz).

The sub-control system(s) 101 may be configured to determine a distance to the object 218 and/or measure the velocity of the object 218 based on the one or more electrical signals that it receives from the TIA 214 via the one or more ADCs 224.

FIG. 3 is a block diagram of a portion of a transceiver 300 for a LIDAR system, according to some implementations of the present disclosure. The transceiver 300 can be included in a LIDAR system, such as the LIDAR system 200 of FIG. 2 (e.g., as the transceiver 230).

The transceiver 300 can include a transmitter 305 (e.g., in a Tx path) and a receiver 310 (e.g., in an Rx path). The transmitter 305 can include or otherwise be in signal communication with a light source 302. The light source 302 can be configured to provide a beam (e.g., a laser beam) to the transmitter 305. In some implementations, a local oscillator (LO) signal may be drawn from the light source 302. The LO signal may be equivalent to the signal from the light source 302 or may be modulated from the signal from the light source 302 (e.g., by an LO modulator such as modulator 204B of FIG. 2). In some implementations, a splitter can split the beam from light source 302 into a first portion provided as the LO signal and a second portion provided to other components of the transceiver 300.

The receiver 310 can include a receiver photonics die 325 configured to receive a received beam from the environment. The received beam can be distributed among a plurality of receive channels 314, where each receive channel 314 captures a portion of transmitted light from a respective transmit channel after being reflected by a corresponding point in the environment. In addition to the receive channels 314, the receiver photonics die 325 can include an LO channel 326 configured to receive the LO signal from the transmitter 305. For instance, the LO channel 326 can be configured to provide the LO signal to detection circuitry for detection of objects.

The light source 302 can provide the beam to a modulator 304 (e.g., a phase modulator). The modulator 304 can be configured to modulate the beam to modify a phase and/or a frequency of the beam. In some embodiments, the modulator 304 can be a silicon phase modulator. The modulator 304 can modulate the beam by, for example, using Continuous Wave (CW) modulation or quasi-CW modulation. In some implementations, the modulator 304 can be disposed on a transmit die or another suitable substrate.

The transceiver 300 can further include one or more splitters configured to split the beam from the light source 302 among one or more channels 312. For instance, a splitter 308 (e.g., an optical splitter) can split the beam from the light source 302 among a plurality of transmit channels 312 that each carry a portion of the beam from the light source 302. For instance, each transmit channel 312 may correspond to respective transmit output (e.g., Tx0, Tx1, etc.). Each transmit channel 312 can provide a portion of the beam to a respective portion of the environment of a LIDAR system such that the LIDAR system can scan multiple points simultaneously. In addition to the transmit channels 312, the LO channel 322 of the transmitter 305 can provide the LO signal to the LO channel 326 of the receiver photonics die 325.

Furthermore, in some implementations, a splitter 306 can generate an alignment signal from the beam from the light source. The splitter 306 can be, for example, a 1×2 optical splitter. The alignment signal can be provided via an alignment channel 332. In addition to the receive channels 314, the receiver 310 can include an alignment channel 336 for facilitating alignment with the transmitter 305. Additionally or alternatively, the alignment channel 336 can be configured to receive an alignment signal from the transmitter 305 that is not emitted into free space, such as a portion of the Tx signal that is split by a splitter 306. Successful receipt of the alignment signal by the alignment channel 336 can indicate proper alignment between the transmitter 305 and the receiver 310. For instance, when the transmitter 305 and the receiver 310 are properly aligned, the alignment signal can successfully pass from the alignment channel 332 of the transmitter 305 to a corresponding alignment channel 336 of the receiver 310. As an example, during an alignment process, the position of one or both of the transmitter 305 and the receiver 310 can be adjusted until the alignment signal successfully passes from the alignment channel 332 of the transmitter 305 to the alignment channel 336 of the receiver 310. In this manner, the alignment channels 332 and 336 can be used to evaluate proper alignment of the transceiver 300.

The transceiver 300 can include an amplifier stage 315 (or amplifier array) having one or more amplifiers 340 configured to receive the beam from the light source 302 and amplify the beam. The amplifiers 340 may be, for example, semiconductor optical amplifiers (SOAs). According to example aspects of the present disclosure, the amplifiers 340 may be provided as individualized SOA dies (e.g., rather than a monolithic array of SOAs, such as a single SOA array die). In some implementations, the amplifiers 340 may be mounted or otherwise coupled to a thermally conductive substrate. The thermally conductive substrate can improve thermal dissipation and isolation between the amplifiers 340. As one example, the thermally conductive substrate may be or may function as a heat sink.

In some embodiments, the amplifiers 340 may be disposed respective to the transmit channels 312. Furthermore, in some embodiments, amplifiers may not be disposed in the alignment channel 332 and/or the LO channel 322. In this manner, the LO channel 322 can pass the LO signal to the receiver photonics die 325 without being amplified by the plurality of SOAs.

According to example aspects of the present disclosure, the beam can pass from the amplifier stage 315 to the receiver photonics die 325. In particular, the transceiver 300 can include a photonics interface 320 configured to interface the beam between the amplifier stage 315 and the receiver photonics die 325 by emitting the beam into free space and receiving the beam reflected from the free space. The photonics interface 320 can be any suitable interface. For instance, in some implementations, the photonics interface 320 can include one or more "coherent pixels" that are capable of emitting and receiving tightly spatially controlled LIDAR beams. As another example, the photonics interface 320 may include or may couple to one or more optics configured to emit or receive a LIDAR signal. Some example configurations of the photonics interface 320 are described in greater detail with respect to FIGS. 4A-5B. It should be understood that other suitable configurations of LIDAR systems are contemplated by the present disclosure.

The transceiver 300 can further include an input interface 342 configured to provide array inputs (e.g., signals from the splitters 306 and 308, the LO signal, etc.) to the amplifiers 340. The input interface 342 can be any suitable interface. As one example, the input interface 342 may be or may include one or more butt couplings between at least one of the one or more array inputs and the amplifiers 340. The butt couplings can be a direct coupling between a surface of an individualized SOA die of an amplifier 340 and at least one of the one or more array inputs. Additionally or alternatively, the input interface 342 can include one or more microlenses. The microlenses can be configured to focus the beam passing through the microlens into or out of the individualized SOA dies. For instance, in some implementations, a first microlens of the input interface 342 is coupled to a die or waveguide carrying signals from the splitter 308 and a second microlens of the input interface 342 can be coupled to one of the amplifiers 340. The first microlens and the second microlens can operate in tandem to focus the beam from the splitter 308 to the amplifier 340. Multiple microlenses may be provided as individualized microlenses or as a monolithic array of microlenses.

Additionally or alternatively, the transceiver 300 can further include an output interface 344 configured to provide array outputs (e.g., signals from the amplifiers 340) to downstream components of the transceiver 300 (e.g., components of the photonics interface 320). The output interface 344 can be any suitable interface. As one example, the output interface 344 may be or may include one or more butt couplings between at least one of the one or more array outputs and the amplifiers 340. The butt couplings can be a direct coupling between a surface of an individualized SOA die of an amplifier 340 and at least one of the one or more array outputs. Additionally or alternatively, the output interface 344 can include one or more microlenses. The microlenses can be configured to focus the beam passing through the microlens into or out of the individualized SOA dies. For instance, in some implementations, a first microlens of the output interface 344 is coupled to a surface of the individualized SOA dies corresponding to amplifiers 340, and a second microlens of the output interface 344 can be coupled to the photonics interface 320. The first microlens and the second microlens can operate in tandem to focus the beam from the amplifier 340 to the photonics interface 320, such that it may be emitted by the LIDAR system. The photonics interface 320 can emit the beam into free space in the direction of the page (e.g., the Z direction).

Figure 3A:
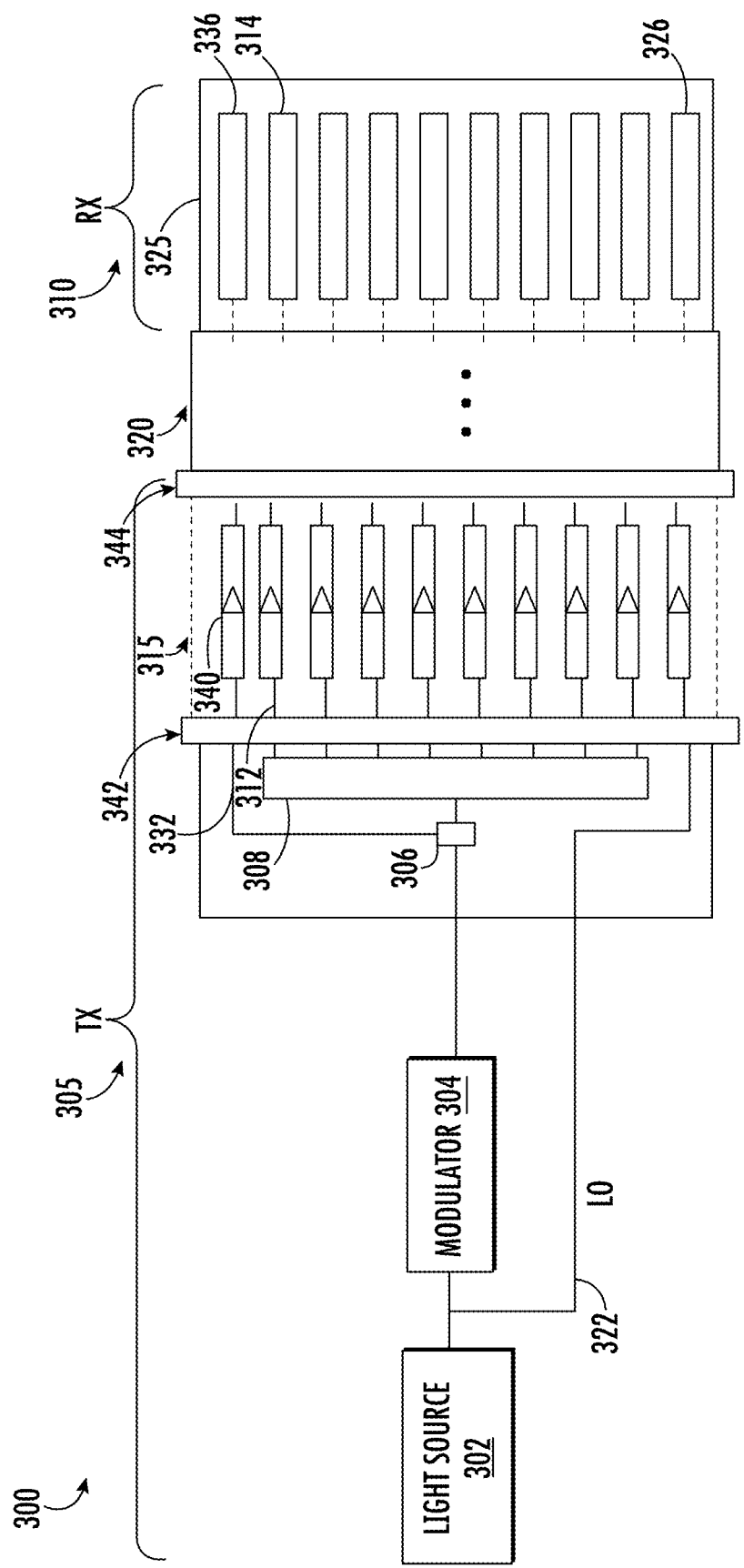
FIGS. 3A-3B depict example transceivers according to some implementations of the present disclosure.
Figure 3B:
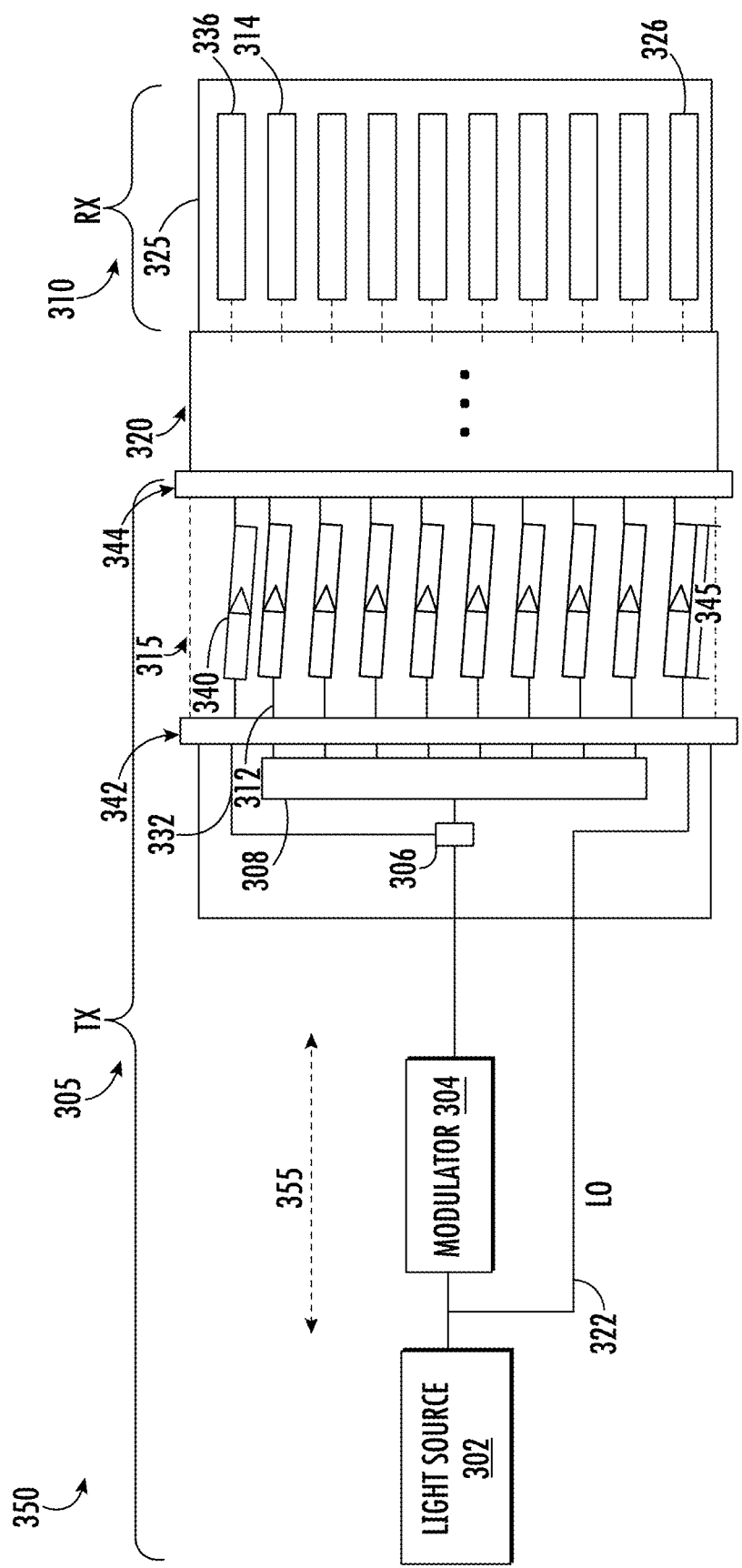

In some implementations, the individualized SOA dies of the amplifiers 340 may be askew relative to the direction of travel of the beam from the light source 302. For instance, FIG. 3B is a block diagram of a transceiver 350 including askew amplifiers, according to some implementations of the present disclosure. Except where otherwise indicated, components of FIG. 3B depicted with like reference numerals are analogous to those described with respect to FIG. 3A.

The individualized SOA dies of the amplifiers 340 may define a lateral dimension 345. The lateral dimension 345 may be, for example, a longest dimension 345 of the individualized SOA dies of the amplifiers 340. As another example, the lateral dimension 345 may be a dimension from which the input to the SOA die propagates to its output. The transceiver 350 (or the LIDAR system) may also define a length dimension 355. The length dimension 355 may be, for example, a longest distance over which the beam from the light source 302 travels from the light source 302 to the point at which it is emitted. As another example, the length dimension 355 may be a longest dimension of the LIDAR system or transceiver 350. The askew SOA dies of the amplifiers 340 may be aligned such that there is a nonzero (or) non −180° angular offset between their lateral dimension 345 and the length dimension 355 of the LIDAR system. For instance, in some implementations, the individualized SOA dies can be aligned such that a lateral dimension 345 of the individualized SOA dies is angled greater than about 10 degrees (e.g., in a range from about 10 degrees to about 20 degrees) from a length dimension 355 defined by the LIDAR system. As used herein, "about" in conjunction with a stated number is intended to refer to within 20% of the stated number, unless stated otherwise.

FIGS. 4A-4B depict a portion of a transceiver that may be employed in a LIDAR system according to example aspects of the present disclosure. In particular, FIG. 4A depicts a top view of a portion of a transceiver 400 for a LIDAR system according to some implementations of the present disclosure. Furthermore, FIG. 4B depicts a side view of a portion of the transceiver 400 of FIG. 4A according to some implementations of the present disclosure. The transceiver 400 of FIGS. 4A-4B may be provided as or included in, for example, photonics interface 320 of FIGS. 3A-3B.

The transceiver 400 can include a transmit die 410 having a plurality of channels 415, including one or more transmit channels 412, an alignment channel 414, and an LO channel 416. The transmit die 410 may be composed of any suitable material, such as, for example, a group III-V semiconductor material. In some implementations, the alignment channel 414 and/or the LO channel 416 may be omitted. The transmit die 410 can be configured to receive a transmit beam 462 from a light source (not illustrated) that is configured to output the transmit beam 462. The transmit beam 462 may be split among the plurality of channels 415. The transmit channels 412 can be respective to one or more individualized SOA dies (not illustrated) configured to amplify the transmit beam 462. Additionally or alternatively, in some implementations, the alignment channel 414 or the LO channel 416 may include one or more individualized SOA dies.

The transceiver 400 can additionally include at least one modulator configured to receive the transmit beam 462 from the light source and modify at least one of phase or frequency of the transmit beam 462. In some implementations, the SOAs may be disposed subsequent to the modulator(s) in relation to the direction of travel of the transmit beam 462.

The light source can be configured to output the transmit beam 462 at a first orientation. For instance, the first orientation may be generally coplanar with the transmit die 410 and/or the plurality of channels 415. The first orientation may be, for example, an angular orientation generally describing direction of movement of photons in the transmit beam 462. The first orientation may be described with respect to any suitable consistent reference.

The transceiver 400 can further include a first reflective surface 432 configured to redirect the transmit beam 462 from the first orientation to a second orientation. For instance, the beam may be provided from the transmit die 410 such that the beam is incident on the first reflective surface 432. The first reflective surface 432 may then redirect photons incident on the first reflective surface 432 from the first orientation to the second orientation. In some implementations, the second orientation is normal or substantially normal (e.g., within about 10 degrees of normal) to the first orientation. As one example, the second orientation may be normal to or substantially normal to a plane generally coplanar with the transmit die 410. The LIDAR system can emit the transmit beam 462 at the second orientation into an environment of the LIDAR system. For instance, the second orientation may be generally directed away from the LIDAR system and/or the AV. The second orientation may be directed in a direction associated with optics or other gap in a housing of the LIDAR system.

To provide the transmit beam 462 to the first reflective surface 432, the transceiver 400 can include a first lens interface 420. The first lens interface 420 can be configured to receive the transmit beam 462 at the first orientation and focus the transmit beam 462 onto the first reflective surface 432. For instance, the first lens interface 420 can include one or more lenses that are aligned with the plurality of channels 415. As one example, a centroid of the lenses in the first lens interface 420 may be substantially co-located with the central axes of the channels 415. In some implementations, the first lens interface 420 can include at least one first lens 422 configured to collimate the transmit beam 462 to produce a collimated beam. The at least one first lens 422 can be a plurality of first lenses 422 respectively associated with the channels 415. The first lens interface 420 can further include a half-wave plate (HWP) 424 configured to shift a polarization direction of the transmit beam 462. The HWP 424 can be constructed out of a birefringent material (e.g., quartz, mica, or plastic), for which the index of refraction is different for light linearly polarized along one or the other of two perpendicular crystal axes. The HWP 424 can provide for improved capability of isolating light emitted by the LIDAR system from other light in the environment. The first lens interface 420 can additionally include at least one second lens 426 configured to focus the collimated beam at a focal point on the first reflective surface 432. For instance, the at least one second lens 426 can be a plurality of second lenses 426 respectively associated with the channels 415. Collimating and focusing the beam respective to the channels 415 can provide for reduced divergence in the transmit beam 462(s) and improved detection fidelity. In some implementations, an alternative interface may be included in place of first lens interface 420. For instance, one or more of the first lenses 422, the HWP 424, or the second lenses 426 may be omitted. As another example, a different type of interface (e.g., a butt coupling interface) may be included in place of the first lens interface 420.

The transceiver 400 can further include a receiver photonics die 450. The receiver photonics die 450 can be configured to receive a received beam 464 (e.g., respective to the plurality of channels 415) from the environment. To provide for tightly controlled correlation between the transmit beam 462 and the received beam 464, the receiver photonics die 450 can be substantially coplanar with the transmit die 410. Furthermore, to pass the beam from the transmit die 410 to the receiver photonics die 450, the transceiver 400 can pass the signal from the alignment channel 414 and LO channel 416 of the transmit die 410 to corresponding alignment channel 454 and LO channel 456 of the receiver photonics die 450 (e.g., without being reflected by the first reflective surface 432).

Additionally, the transceiver 400 can further include a second reflective surface 434 configured to receive a received beam 464 from the environment of the LIDAR system and provide the received beam 464 among a plurality of receive channels 452. The received beam 464 can be received at the second orientation and redirected by the second reflective surface 434 from the second orientation to the first orientation. The transceiver 400 can additionally include a second lens interface 440 configured to focus the received beam 464 into the receiver photonics die 450. In some implementations, the second lens interface 440 can include at least one first lens 442 configured to collimate the transmit beam 462 to produce a collimated beam. The at least one first lens 442 can be a plurality of first lenses 442 respectively associated with channels 455 of the receiver photonics die 450. The second lens interface 440 can further include at least one second lens 444 configured to focus the collimated beam at a focal point on the first reflective surface 432. For instance, the at least one second lens 444 can be a plurality of second lenses 444 respectively associated with the channels 455. Collimating and focusing the beam respective to the channels 455 can provide for reduced divergence in the transmit beam 462(s) and improved detection fidelity. In some implementations, an alternative interface may be included in place of second lens interface 440. For instance, one or more of the first lenses 442, or the second lenses 444 may be omitted. As another example, a different type of interface (e.g., a butt coupling interface) may be included in place of the second lens interface 440.

For instance, the portion of the beam from the transmit channels 412 can be focused by the first lens interface 420 onto the first reflective surface 432, emitted into free space, reflected off of objects in the free space such that the beam is incident on the second reflective surface 434, reflected off the second reflective surface 434 into the second lens interface 440, and focused by the second lens interface 440 into the plurality of receive channels 452. In this manner, the first reflective surface 432 and the second reflective surface 434 may form a "coherent pixel" capable of both emitting and receiving a tightly spatially controlled LIDAR beam.

In some implementations, the first reflective surface 432 and the second reflective surface 434 may be disposed on a common feature 430. The feature 430 may be separate from the transmit die 410 and/or the receiver photonics die 450. The reflective surfaces 432, 434 may be formed by a reflective coating on the feature 430. As one example, the reflective coating may be a metal coating.

Figure 5A:
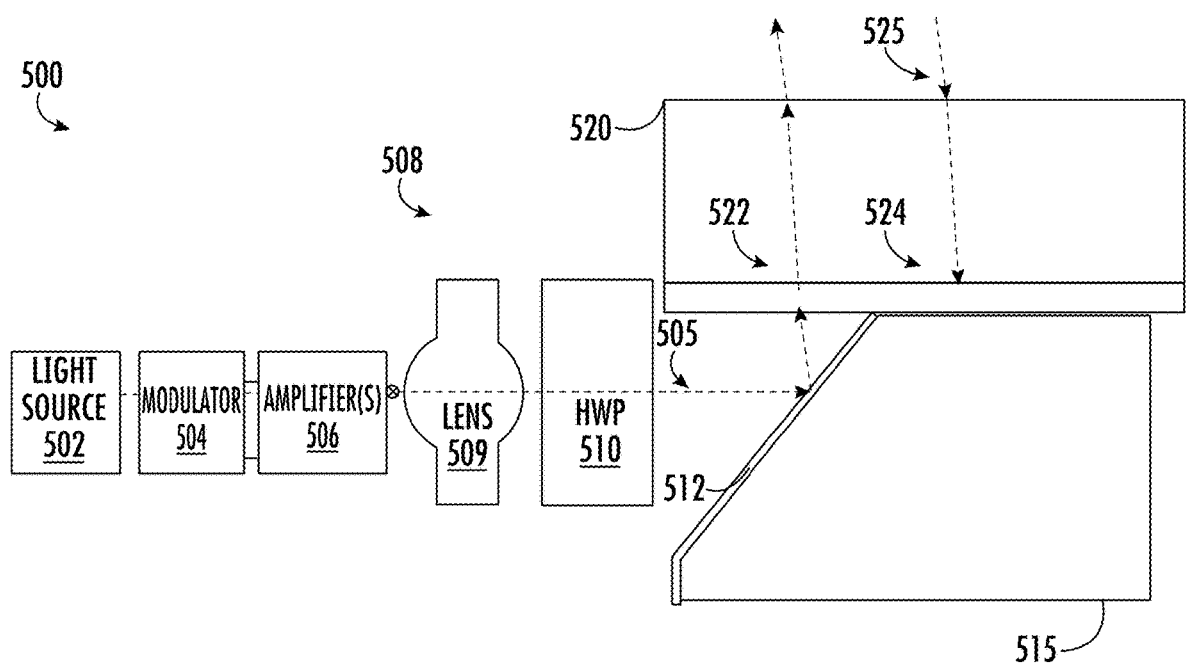
FIGS. 5A-5C depict an example transceiver according to some implementations of the present disclosure.
Figure 5B:
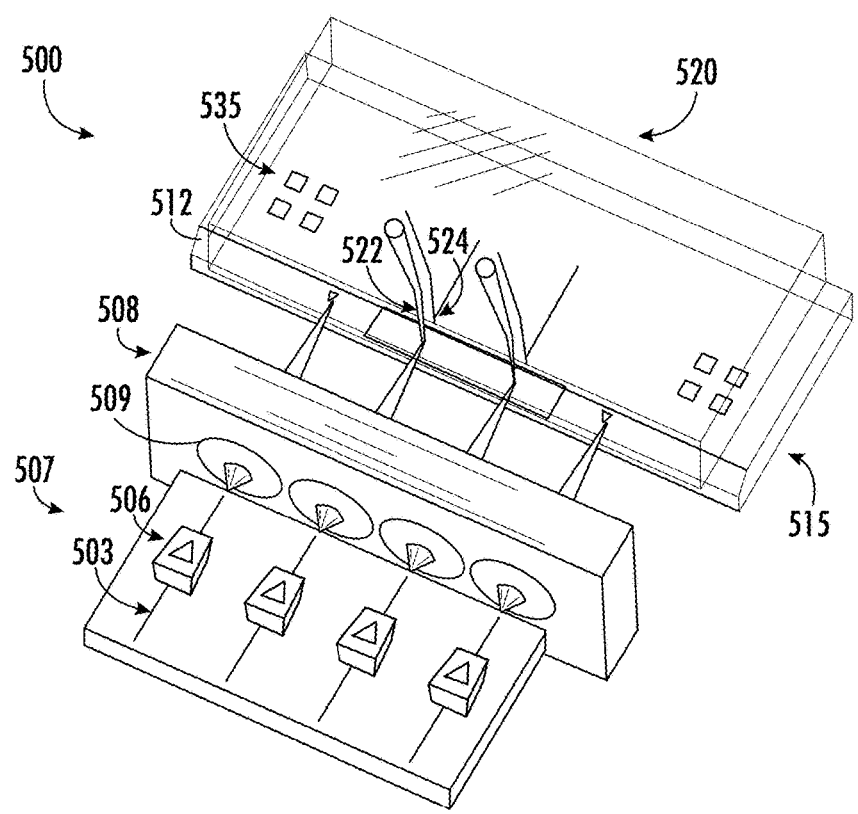

FIGS. 5A-5B depict another example transceiver that may be employed in a LIDAR system according to example aspects of the present disclosure. In particular, FIG. 5A depicts a side view of a portion of an example transceiver 500 for a LIDAR system. Furthermore, FIG. 5B depicts a perspective view of a portion of the example transceiver 500 of FIG. 5A.

The transceiver 500 can include a light source 502. The light source 502 can be configured to provide a transmit beam 505 (e.g., a laser beam) to downstream components of the transceiver 500. For instance, the light source 502 can provide the transmit beam 505 to a modulator 504 (e.g., a phase modulator). The modulator 504 can be configured to modulate the transmit beam 505 to modify a phase and/or a frequency of the transmit beam 505. In some embodiments, the modulator 504 can be a silicon phase modulator. The modulator 504 can modulate the transmit beam 505 by, for example, using Continuous Wave (CW) modulation or quasi-CW modulation. In some implementations, the modulator 504 can be disposed on a transmit die or another suitable substrate.

The transceiver 500 can include one or more amplifiers 506 configured to receive the transmit beam 505 the modulator 504 and amplify the transmit beam 505. The amplifier(s) 506 may be, for example, semiconductor optical amplifiers (SOAs). As one example, the transceiver 500 may include a plurality of amplifiers 506 respective to a plurality of channels 503. The amplifiers 506 can be provided as individualized SOA dies according to example aspects of the present disclosure. The individualized SOA dies including the amplifiers 506 may be mounted or otherwise attached to a transmit die 507. In some examples, the transmit die 507 may be a thermally conductive substrate. The transmit die 507 can provide space between sidewalls of each of the amplifiers 506, which can improve heat dissipation and/or reduce thermal crosstalk between the amplifiers 506. As one example, a space between the sidewalls of each of the amplifiers 506 may be from about 0.5 mm to about 2 mm, such as from about 1 mm to about 1.5 mm, such as about 1 mm, such as about 1.5 mm, such as about 1.25 mm. Additionally or alternatively, the transmit die 507 may include other components of the Tx path, such as the light source 502 or the modulator 504.

Figure 5C:
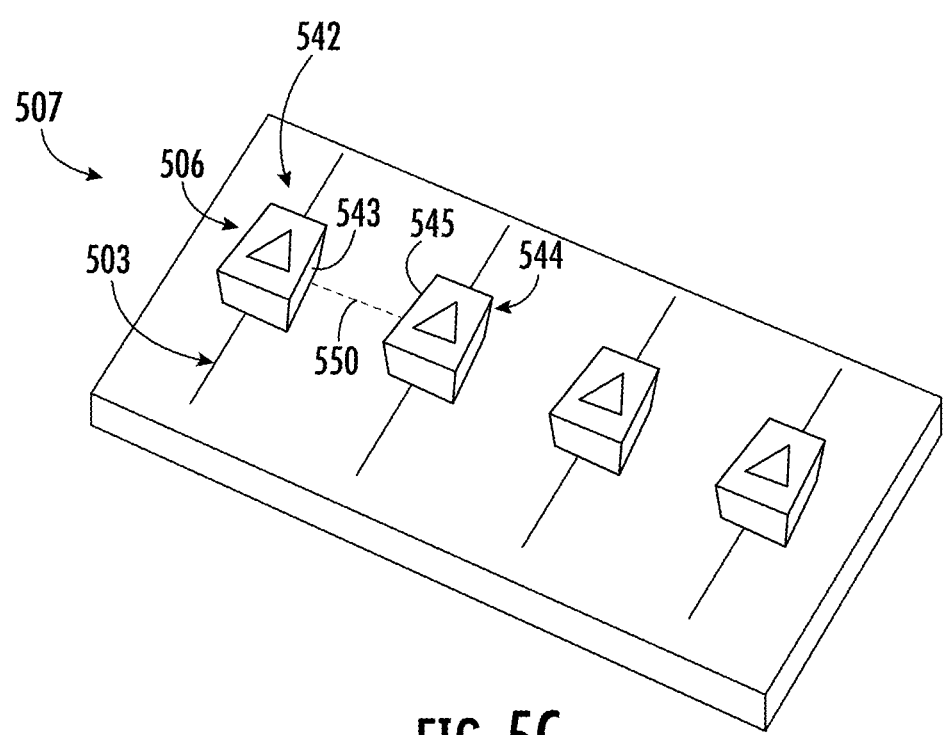

In some implementations, the amplifiers 506 (e.g., individualized SOA dies) can be spaced apart from each other. An example spacing is illustrated with respect to FIG. 5C. As illustrated in FIG. 5C, a first individualized SOA die 542 of the amplifiers 506 can be spaced apart from a second individualized SOA die 544 of the amplifiers 506. For instance, a spacing 550 can be defined between the first individualized SOA die 542 and the second individualized SOA die 544. As one example, the spacing 550 can be defined between a sidewall 543 of the first individualized SOA die 542 and a sidewall 545 of the second individualized SOA die 544. As one example, the spacing 550 between the sidewalls 543, 545 may be from about 0.5 mm to about 2 mm, such as from about 1 mm to about 1.5 mm, such as about 1 mm, such as about 1.5 mm, such as about 1.25 mm. For instance, the transmit die 507 can provide space between sidewalls 543, 545 of each of the amplifiers 506 (e.g., the dies 542, 544), which can improve heat dissipation and/or reduce thermal crosstalk between the amplifiers 506.

The transceiver 500 can further include a lens interface 508. The lens interface 508 can be configured to focus the transmit beam 505 from the amplifier(s) 506 onto a reflective surface 512. For instance, the transmit beam 505 may be provided by the lens interface 508 such that the transmit beam 505 is incident on the reflective surface 512. The reflective surface 512 may then redirect photons incident on the reflective surface 512 from the first orientation to the second orientation. In some implementations, the second orientation is normal or substantially normal (e.g., within about 10 degrees of normal) to the first orientation. As one example, the second orientation may be normal to or substantially normal to a plane generally coplanar with the transmit die 507.

The LIDAR system can emit the transmit beam 505 at the second orientation into an environment of the LIDAR system. For instance, the second orientation may be generally directed away from the LIDAR system and/or the AV. The second orientation may be associated with optics or other gaps in a housing of the LIDAR system.

The lens interface 508 can include one or more lenses 509. For instance, in some implementations, the lens interface 508 can include at least a first lens configured to collimate the transmit beam 505 to produce a collimated beam and a second lens configured to focus the collimated beam at a focal point on the reflective surface 512. The transceiver 500 can further include a half-wave plate (HWP) 510 configured to shift a polarization direction of the transmit beam 505. The HWP 510 can be constructed out of a birefringent material (e.g., quartz, mica, or plastic), for which the index of refraction is different for light linearly polarized along one or the other of two perpendicular crystal axes. The HWP 510 can provide for improved capability of isolating light emitted by the LIDAR system from other light in the environment.

The transceiver 500 can further include a receiver photonics die 520. The receiver photonics die 520 can be configured to receive a received beam 525 (e.g., respective to a plurality of channels) from the environment. To provide for tightly controlled correlation between the transmit beam 505 and the received beam 525, the receiver photonics die 520 can be disposed above the reflective surface 512 such that the transmit beam 505 passes through the receiver photonics die 520 after being reflected by the reflective surface 512. For instance, the receiver photonics die 520 can include a transmit portion 522 through which the transmit beam 505 passes after being reflected by the reflective surface 512. As used herein, "above" is intended to be defined relative to the direction traveled by the transmit beam 505 in the second orientation. For instance, the receiver photonics die 520 may be disposed above the reflective surface 512 if the transmit beam 505 passes through the receiver photonics die 520 after being reflected by the reflective surface 512, even if the receiver photonics die 520 is not above the reflective surface 512 relative to earth gravity or another contrasting reference.

In addition, the receiver photonics die 520 can include a receiving portion 524 offset from the transmit portion 522. The receiving portion 524 can be configured to receive the received beam 525 from the environment of the LIDAR system and provide the received beam 525 to at least one photonics component on the receiver photonics die 520 and/or downstream components of the LIDAR system (e.g., a mixer or signal processing photonics). For instance, the receiving portion 524 may not be transparent to the received beam 525. As one example, the receiving portion 524 may be formed by a waveguide or other light-steering component.

In some implementations, the reflective surface 512 may be formed on a substrate 515. The reflective surface 512 may be formed by a reflective coating on the substrate 515, for example. As one example, the reflective coating may be a metal coating. The substrate 515 may be separate from the transmit die 507 and/or the receiver photonics die 520. The substrate 515 may be generally parallel to the receiver photonics die 520. Furthermore, the reflective surface 512 may be formed on an angled edge of the substrate 515. For instance, a plane that is coplanar to the reflective surface 512 may be neither parallel nor orthogonal to planes defining the transmit die 507, the receiver photonics die 520, or the substrate 515.

In some implementations, the substrate 515 and the receiver photonics die 520 can each include one or more alignment guides 535 indicating an alignment between the substrate 515 and the receiver photonics die 520. For instance, the alignment guides 535 can be a common or correlated pattern between the substrate 515 and the receiver photonics die 520. The alignment guides 535 can therefore be measured during manufacturing to indicate when the substrate 515 and the receiver photonics die 520 are properly aligned. As one example, the alignment guides 535 may be formed by photolithography or other high-precision process such that the alignment guides 535 can provide a level of precision that satisfies strict constraints associated with the present LIDAR systems.

Figure 6A:
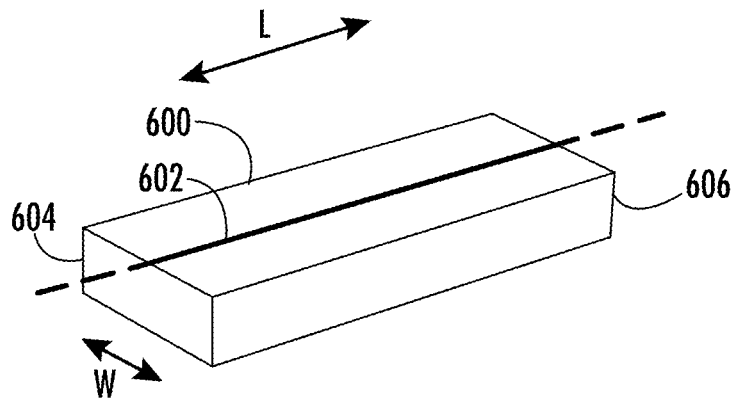
FIGS. 6A-6C depict example individualized SOA dies according to some implementations of the present disclosure.
Figure 6B:
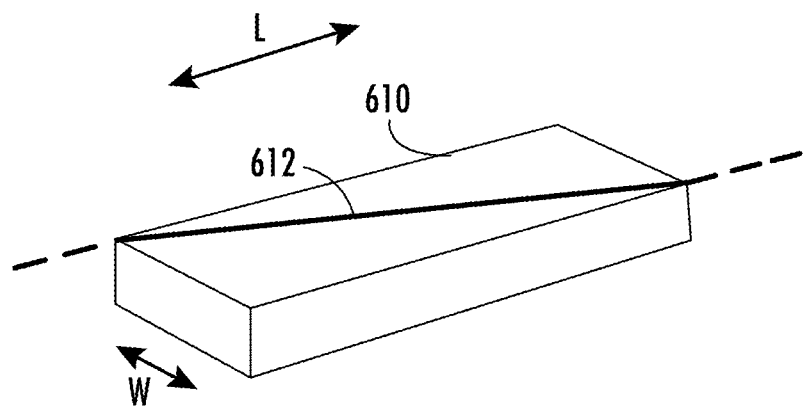
Figure 6C:
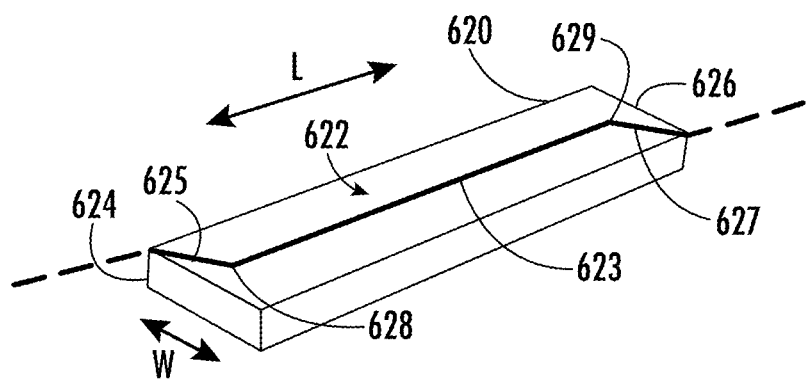

FIGS. 6A-6C depict example individualized SOA dies according to some implementations of the present disclosure. In particular, FIG. 6A depicts an example individualized SOA die 600 according to example aspects of the present disclosure. The SOA die 600 includes a waveguide 602 configured to provide light from a first end 604 of the SOA die 600 to a second end 606 of the SOA die 600. For instance, the first end 604 can be an input and the second end 606 can be an output. The SOA die can be configured to amplify the light passing from the first end 604 to the second end 606.

The SOA die 600 includes a waveguide 602 that is substantially parallel to a lateral dimension L of the SOA die 600. For instance, the lateral dimension L can be a longest dimension of the SOA die 600. The parallelism of the waveguide 602 and the lateral dimension L can provide for a relatively low width dimension W of the SOA die 600, which can be beneficial in certain LIDAR-related applications. For instance, having a lower width dimension W can provide for smaller spaces to include the SOA die 600. However, the inputs and outputs of the SOA die 600 will generally be flush with the first end 604 and the second end 606 (e.g., respectively) of the SOA die 600. In cases of slight misalignment between the waveguide 602 and the inputs and outputs, the flush surfaces of the first end 604 and second end 606 can aggravate reflections caused by the misalignment.

FIG. 6B depicts an example individualized SOA die 610 with a non-parallel waveguide 612. The SOA die 610 is similar to the SOA die 600 except where otherwise described. Unlike the parallel waveguide 602 of FIG. 6A, the waveguide 612 has a nonzero angular offset relative to the lateral dimension L. In the case of slight misalignment between the waveguide 612 and the inputs and outputs of the SOA die 610, the angle between the waveguide 612 and the inputs and outputs can mitigate the effect of the reflections caused by the misalignment. For instance, reflections produced by a misaligned waveguide at a zero angular offset relative to the lateral dimension L may travel directly against the signal propagating through the waveguide, which may result in counteracting energy of the signal in the waveguide and/or traveling through the waveguide to reflection-sensitive components. Reflections produced by a misaligned waveguide at a nonzero angular offset relative to the lateral dimension L may travel at a different direction to the signal propagating through the waveguide, resulting in a smaller energy component in the direction of the signal and attenuation as the reflection bounces off the sidewalls of the waveguide. However, the angled waveguide 612 can provide a greater width dimension W of the SOA die 610 to support the angle of the waveguide 612 compared to a waveguide that is nearly aligned with the lateral dimension, such as the waveguide 602 of FIG. 6A.

FIG. 6C depicts an example individualized SOA die 620. The SOA die 620 is similar to the SOA die 600 except where otherwise described. The SOA die 620 can include a waveguide 622 having a lateral portion 623, a first angled portion 625, and a second angled portion 627. The lateral portion 623 can be substantially parallel to the lateral dimension L of the SOA die 620. For instance, the lateral portion can define an angle within about 10 degrees of the lateral dimension L. The first angled portion 625 can extend from a first end 628 of the lateral portion 623. For instance, the first angled portion 625 can extend between the first end 628 of the lateral portion 623 and a first end 624 of the SOA die 620. The second angled portion 627 can extend from a second end 629 of the lateral portion 623. For instance, the second angled portion 627 can extend between the second end 629 of the lateral portion 623 and a second end 626 of the SOA die 620.

One or both of the first angled portion 625 or the second angled portion 627 can be angled at greater than about 10 degrees from the lateral dimension L of the individualized SOA die. For instance, in some implementations, one or both of the first angled portion 625 or the second angled portion 627 can define an angle between about 10 degrees from the lateral dimension L of the individualized SOA die 620 and about 45 degrees from the lateral dimension L of the individualized SOA die 620.

The waveguide 622 can simultaneously provide certain beneficial aspects of the waveguides 602 and 612 of FIGS. 6A-6B. In particular, the waveguide 622 can provide a reduced width relative to a purely angled waveguide (e.g., waveguide 612) and reduced reflections in the case of misalignment relative to a purely straight waveguide (e.g., waveguide 602).

Although discussed with reference to disadvantages, it should be understood that the example SOA dies 600 and 610 are not intended to be disparaged by the present disclosure, and may provide other advantages relative to the SOA die 620 that justify their incorporation with aspects of the present disclosure. LIDAR systems including any of the SOA dies 600, 610, and 620 are expressly contemplated by the present disclosure.

Figure 7A:
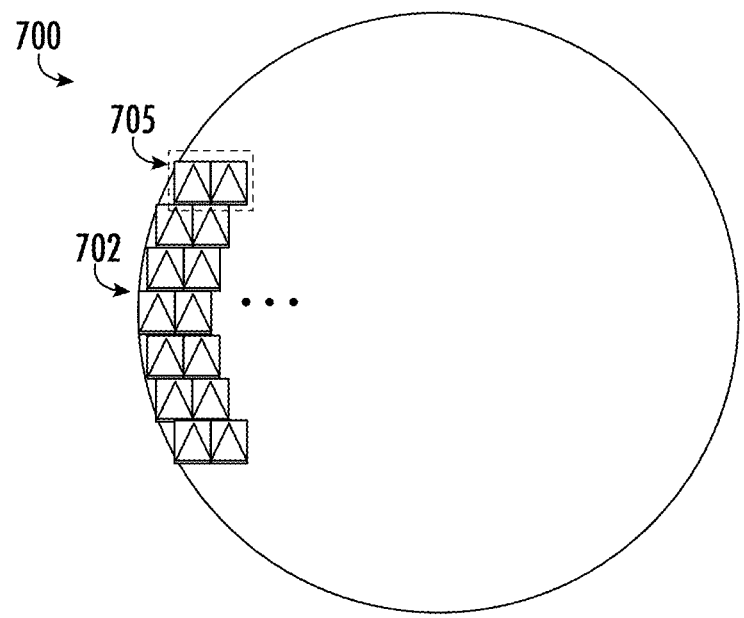
FIGS. 7A-7B depict an example semiconductor wafer according to some implementations of the present disclosure.

FIG. 7A depicts an example semiconductor wafer 700 according to some implementations of the present disclosure. The semiconductor wafer 700 can be formed of any suitable semiconductor material, such as crystalline silicon. One or more SOA regions 702 may be formed on the semiconductor wafer 700. The SOA regions 702 can respectively correspond to functional semiconductor optical amplifiers. For instance, the SOA regions 702 can encompass a semiconductor optical amplifier that may be included in a LIDAR system according to example embodiments of the present disclosure.

Figure 7B:
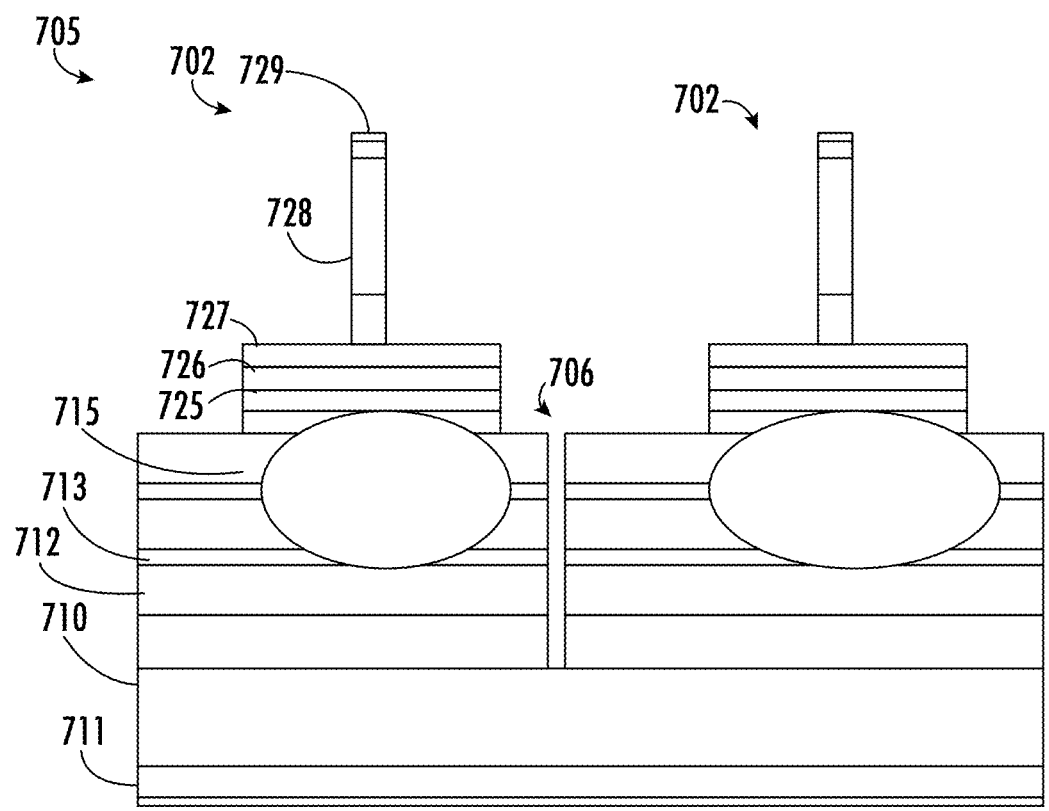

FIG. 7B depicts a cross-sectional view of an example portion 705 of the semiconductor wafer 700 including two SOA regions 702 according to some implementations of the present disclosure. Each of the SOA regions 702 can correspond to a unique semiconductor stack. As used herein, a semiconductor stack refers to a plurality of layers of materials, such as semiconductor materials, formed on or extending from a substrate or wafer (e.g., semiconductor wafer 700 of FIG. 7A). A respective semiconductor stack may form, compose, or otherwise make up a respective semiconductor device, such as a modulator, amplifier, or other suitable semiconductor device. Respective semiconductor stacks may be, but are not necessarily, separated by surface features of the substrate, such as trench features.

The SOA region 702 can be formed on a substrate 710. The substrate 710 can be, for example, the semiconductor material of the semiconductor wafer 700 of FIG. 7A. The SOA region 702 can have one or more waveguide layers 712. The waveguide layers 712 can be configured to pass or propagate an optical signal (e.g., from a light source) through the SOA region 702. In some implementations, the waveguide layers 712 can be formed of a group III-V semiconductor material. For instance, the group III-V semiconductor material can be or can include indium phosphide (InP), gallium arsenide (GaAs), indium arsenide (InAs), gallium nitride (GaN), indium antimonide (InSb), or another group III-V semiconductor material. The use of a group III-V material can, in some cases, provide improved transmission characteristics for optical signals. A thickness of the waveguide layers 712 can facilitate conductivity and thermal dissipation. In some implementations, the thickness of the waveguide layers 712 can be from about 100 microns to about 300 microns.

In some implementations, the waveguide layers 712 can be separated by one or more spacer layers 713. The spacer layers 713 can be formed of silicon dioxide ($SiO_2$) or another suitable material. As another example, in some implementations, the spacer layers can be formed of a group III-V semiconductor material, such as a different group III-V semiconductor material than the waveguide layers 712. The spacer layers 713 can have a thickness of from about 100 microns to about 300 microns.

The SOA region 702 depicts one example configuration of an SOA, including an n-doped group III-V semiconductor (e.g., InP) layer 725, a multiple quantum wells (MQW) layer 726, a p-doped group III-V semiconductor (e.g., InP) layer 727, a p-doped group III-V semiconductor layer 728, and an insulating layer 729. Each of the layers 725-729 can be formed (e.g., by regrowth or other suitable method) on the surface of the wafer 700. The layers 725-729 collectively act or function as amplification layers that amplify the signal passing through the SOA region 702. For instance, the opposing p-n junctions of the n-doped layer 725 and p-doped layers 727, 728 can induce optical nonlinearities in the MQW layer 726, which can in turn produce an amplification effect.

The n-doped semiconductor layer 725 can be formed of any suitable semiconductor, such as a group III-V semiconductor, silicon, etc. The n-doped semiconductor layer 725 can be doped with any suitable n-dopant, such as phosphorus, silicon, zinc, arsenic, or other suitable dopant. The n-doped semiconductor layer 725 can have any suitable thickness, such as a thickness of between about 10 and about 500 microns. The MQW layer 726 can provide a plurality of quantum wells having barriers with a thickness such that adjacent wave functions may not couple. The p-doped group III-V semiconductor layer(s) 727, 728 can be formed of any suitable group III-V semiconductor. The p-doped group III-V semiconductor layer(s) 727, 728 can be doped with any suitable p-dopant, such as boron, silicon, zinc, indium, or other suitable dopant. The p-doped group III-V semiconductor layer(s) 727, 728 can have any suitable thickness, such as a thickness of between about 10 and about 500 microns. The insulating layer 729 can insulate the layers of the SOA region 702 from outside electrical contact. The insulating layer 729 can be formed of any suitable insulating material, such as titanium, etc. It should be understood that the SOA depicted in FIG. 7B is exemplary, and any suitable SOA may be formed in SOA region 702, including SOA architectures that differ in various aspects from the example in FIG. 7B. In addition, while the layers of the SOA region 702 have been described above with specific materials, it should be understood that the layers may be constructed of other materials, including but not limited to, indium phosphide (InP), gallium arsenide (GaAs), indium arsenide (InAs), gallium nitride (GaN), or indium antimonide (InSb).

Prior to dicing, in some implementations, individual SOA regions 702 can be isolated by one or more respective deep ridge etches 706 (only one deep ridge etch 706 being shown in FIG. 7B for ease of illustration). For instance, the deep ridge etch 706 can be etched from the top of the layers 725-729 to the substrate 710. The deep ridge etch 706 can isolate the SOA regions 702 such that each SOA region 702 forms an independent SOA. The semiconductor wafer 700 may then be diced along respective deep ridge etches 706 to form a plurality of individualized SOA dies, each corresponding to one of the SOA regions 702.

The optical modes 715 represent an intensity profile of light within the SOA region 702. The formation of the SOA region 702 (e.g., including the various layers) can produce optical modes 715 that are primarily concentrated in the waveguide layers 712. For instance, the width of the upper layers, such as the MQW layer 726, etc. may generally increase relative to layers closer to the substrate 710, such as the waveguide layers 712, forming a "pyramid" or "step" configuration. This configuration can cause the optical modes 715 to concentrate in the wider layers near the base of the SOA regions 702.

In some implementations, the substrate 710 can have an antireflection layer 711 formed on a surface opposite the SOA regions 702 The antireflection layer 711 can be formed of a material having a low reflectivity such that the antireflection layer 711 does not reflect a significant amount of light incident on the individualized SOA dies formed from SOA regions 702. Alternatively, in some implementations, the antireflection layer 711 may be omitted.

Figure 8:
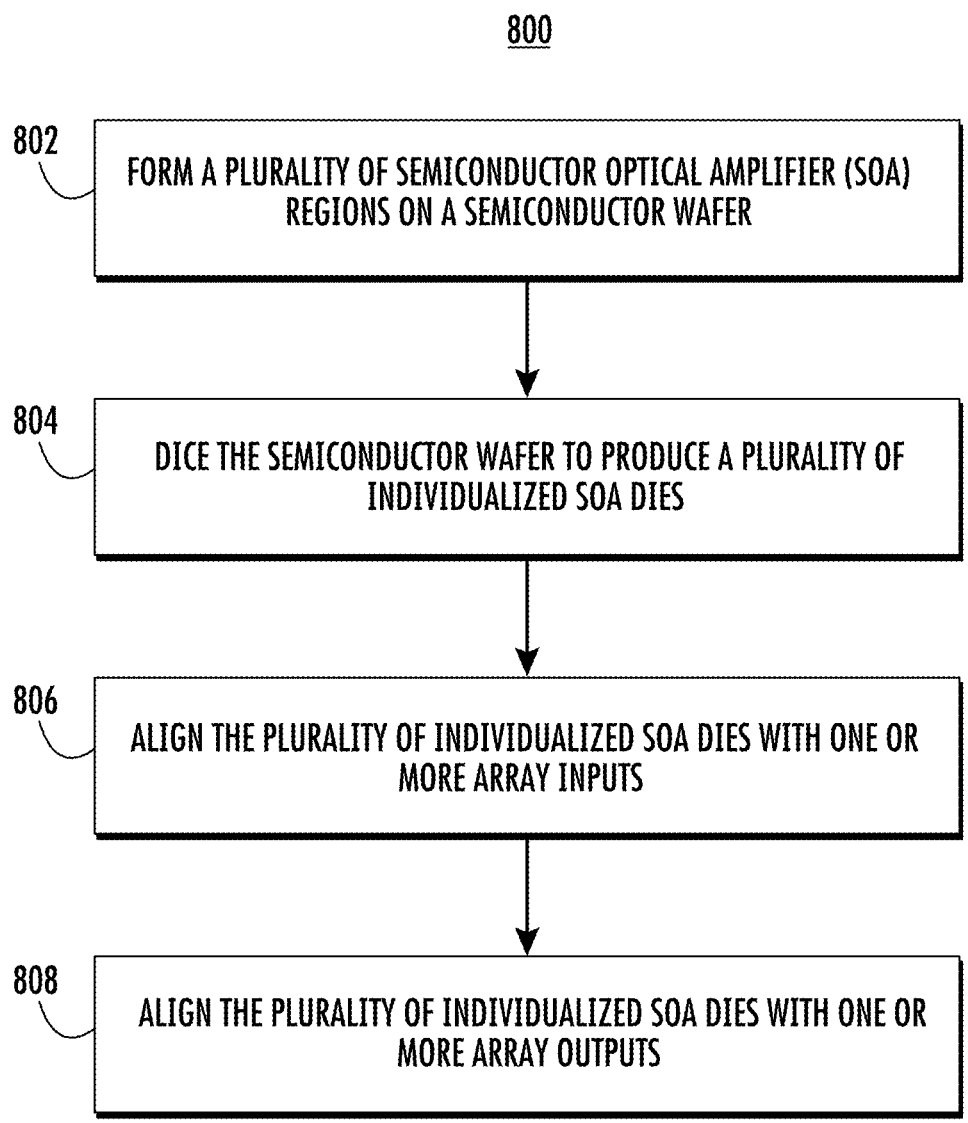
FIGS. 8-10C depict flowchart diagrams of an example method for manufacturing a semiconductor device for a LIDAR sensor system for a vehicle according to some implementations of the present disclosure.

FIG. 8 is a flowchart of a method 800 for manufacturing a semiconductor device for a LIDAR system for a vehicle according to some implementations of the present disclosure. FIG. 8 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, or modified in various ways without deviating from the scope of the present disclosure.

At 802, the method 800 can include forming a plurality of SOA regions on a semiconductor wafer. For instance, the semiconductor wafer (e.g., the semiconductor wafer 700 of FIG. 7A) may be subjected to one or more growth processes and/or one or more etch processes to form a plurality of SOA regions (e.g., the SOA regions 702) on the semiconductor wafer. As one example, forming the plurality of SOA regions can include (i) forming one or more waveguide layers on the semiconductor wafer; (ii) forming one or more spacer layers between the one or more waveguide layers; and (iii) forming one of more amplification layers above the one or more waveguide layers. The amplification layers can be layers that amplify light passing through the one or more waveguide layers. As examples, forming the one or more amplification layers can include forming at least one of an n-doped semiconductor layer, a multiple quantum wells (MQW) layer, a p-doped semiconductor layer, or an insulating layer. One example method for forming a plurality of SOA regions on a semiconductor wafer is discussed with reference to FIG. 9.

Furthermore, in some implementations, one or more waveguide regions can be formed by the one or more waveguide layers. The waveguide region (e.g., the waveguide 622 of FIG. 6C) can include a lateral portion (e.g., lateral portion 623 of FIG. 6C) defining an angle within about 10 degrees of a lateral dimension of the individualized SOA die. The waveguide can additionally include a first angled portion (e.g., angled portion 625 of FIG. 6C) extending from a first end of the lateral portion. The first angled portion can define an angle greater than about 10 degrees from the lateral dimension of the individualized SOA die. The waveguide can additionally include a second angled portion (e.g., angled portion 627 of FIG. 6C) extending from a second end of the lateral portion. The second angled portion can define an angle greater than about 10 degrees from the lateral dimension of the individualized SOA die.

At 804, the method 800 can include dicing the semiconductor wafer to produce a plurality of individualized SOA dies. The plurality of individualized SOA dies can correspond respectively to the plurality of SOA regions formed on the semiconductor wafer. For instance, the wafer may be etched, sliced, scored, or otherwise manipulated such that the SOA regions are isolated into distinct, individualized SOA dies. For instance, dicing the semiconductor wafer can produce a plurality of semiconductor dies respectively corresponding to, including, or otherwise associated with the individualized SOA dies. As one example, a semiconductor die or individualized SOA die can include only one functional SOA (e.g., defined by a single SOA region). In some implementations, dicing the semiconductor wafer can include scoring the semiconductor region along boundaries of the plurality of SOA regions. As one example, scoring the semiconductor wafer can include forming deep ridge etches corresponding to the boundaries of the SOA regions.

At 806, the method 800 can include aligning the plurality of individualized SOA dies with one or more array inputs. The array inputs can be inputs to an SOA array including the individualized SOA dies. As one example, the SOA array can be an amplification stage of a LIDAR system (e.g., the LIDAR system 200 of FIG. 2) configured to amplify a beam from a light source (e.g., the light source 202) and emit the beam into free space. The array inputs can include, for example, a splitter (e.g., the splitter 308 of FIG. 3A) configured to split the beam from the light source among a plurality of transmit channels (e.g., the transmit channels 312 of FIG. 3A). Each transmit channel can respectively include one of the plurality of individualized SOA dies (e.g., the individualized SOA dies 340 of FIG. 3A). Aligning the plurality of individualized SOA dies can include aligning the SOA dies within the transmit channels.

In some implementations, the method 800 can further include coupling a light source to the one or more array inputs. For instance, the method can include coupling the light source to the one or more array inputs by one or more intervening components, such as, but not limited to, one or more optical splitters, modulators, waveguides, or other suitable components of a LIDAR system.

At 808, the method 800 can include aligning the plurality of individualized SOA dies with one or more array outputs. The array outputs can be outputs of an SOA array including the individualized SOA dies. For example, the array outputs can be optics, coherent pixels, waveguides, or other components of a transmitter of a LIDAR system.

In some implementations, the method 800 can further include coupling one or more coherent pixels to the one or more array outputs. For instance, the coherent pixels can be configured to emit the light amplified by the individualized SOA dies into free space. Additionally or alternatively, the coherent pixels may receive the light from free space after it is reflected by an object in free space. A LIDAR system including the coherent pixels can derive information about the object in free space, such as its position, velocity, etc., by processing the reflected light.

In some implementations, the plurality of SOA dies may be aligned with the array inputs or the array outputs along a first direction and a second direction. For instance, the first direction and the second direction may be a length or width dimension of a larger LIDAR system in which the SOA dies are aligned. In some implementations, the SOA dies may not be aligned along a third direction (e.g., a height or depth dimension), as sufficient alignment may be obtained according to the present disclosure along only two dimensions. This can result from the ability of individualized SOA dies to be aligned independently, unlike a monolithic array of SOAs. In some implementations, the individualized SOA dies can be aligned such that a lateral dimension of the individualized SOA dies is angled greater than about 10 degrees from a length dimension defined by the LIDAR system.

In some implementations, the method 800 can further include forming one or more butt couplings between at least one of the one or more array inputs or the one or more array outputs and the plurality of individualized SOA dies. For instance, the butt couplings may be formed during alignment or as a separate step. The one or more butt couplings can be a direct coupling between a surface of the plurality of individualized SOA dies and the at least one of the one or more array inputs or the one or more array outputs. As one example, butt couplings may be formed at interfaces 342 or 344 of FIG. 3A.

Additionally or alternatively, in some implementations, the method 800 can further include providing one or more microlenses at one or both of the one or more array inputs and the one or more array outputs. The one or more microlenses can be configured to focus the beam passing through the plurality of individualized SOA dies. In some implementations, the microlenses may be provided during alignment or as a separate step. As one example, microlenses may be provided at interfaces 342 or 344 of FIG. 3A.

In some implementations, the method 800 can further include coupling the plurality of individualized SOA dies to a thermally conductive substrate. The thermally conductive substrate can be formed of any suitable thermally conductive material, such as metal. In some implementations, the thermally conductive substrate can be or can function as a heat sink. Furthermore, in some implementations, the thermally conductive substrate may additionally support one or more other components of a LIDAR system, such as, for example, one or more splitters, one or more modulators, etc. The thermally conductive substrate can improve thermal isolation and reduce thermal crosstalk between the plurality of individualized SOA dies.

Figure 9:
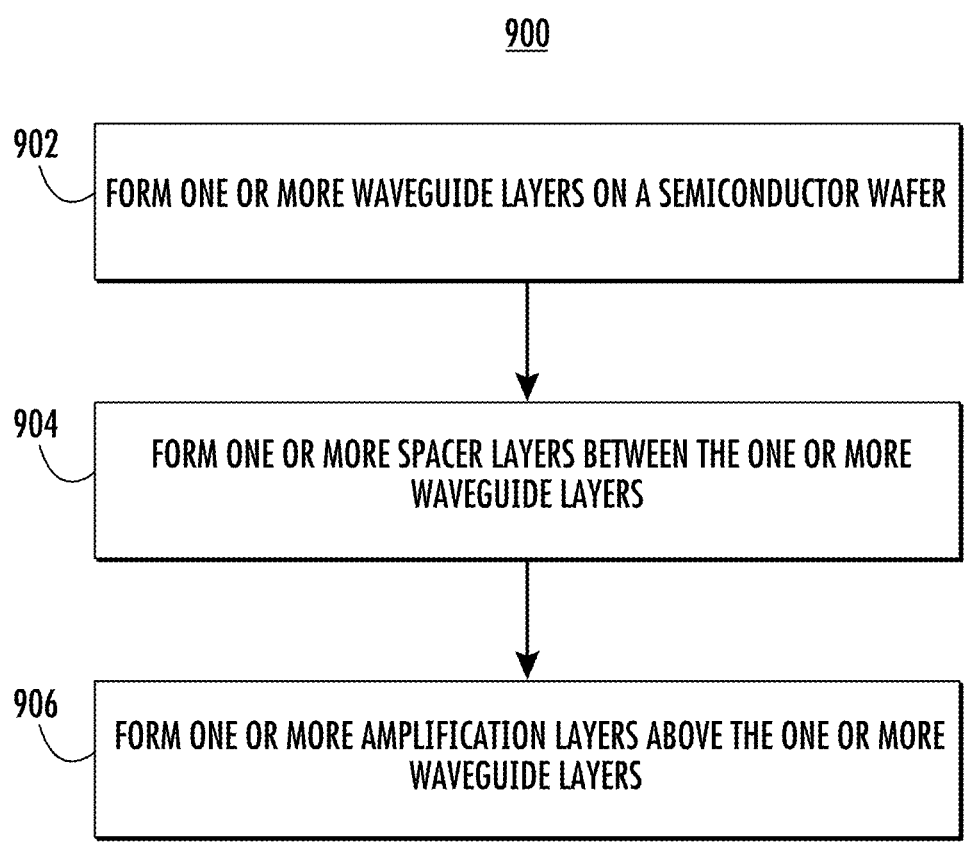

FIG. 9 depicts an example method 900 for forming an SOA region (e.g., SOA region 702 of FIGS. 7A-7B) according to some implementations of the present disclosure. The method 900 may be performed on a semiconductor wafer, such as the wafer 700 of FIG. 7A. The steps of method 900 may be incorporated into other methods disclosed herein as suitable, such as, for example, into method 800 of FIG. 8.

The method 900 can include, at 902, forming one or more waveguide layers on a semiconductor wafer. The waveguide layers can be, for example, the waveguide layers 712 of FIG. 7B. The waveguide layers 712 may be formed to resemble a suitable shape for transmitting light from one end of the SOA region to another. As examples, a top-down view of the waveguide layers 712 corresponding to a particular SOA region may resemble any of the waveguide regions 602, 612, or 622 from FIGS. 6A-6C, or another suitable shape. Forming the waveguide layers can include depositing material on the semiconductor wafer through one or more deposition processes, such as metal organic chemical vapor deposition (MOCVD) processes. Additionally or alternatively, forming the waveguide layers can include one or more etch processes (e.g., chemical and/or other suitable etch processes), annealing processes, or other suitable manufacturing processes.

The method 900 can include, at 904, forming one or more spacer layers between the one or more waveguide layers. The spacer layers can be, for example, the spacer layers 713 of FIG. 7B. The spacer layers may be formed of any suitable material, such as silicon dioxide ($SiO_2$) or another suitable material. Forming the spacer layers can include depositing material on the semiconductor wafer through one or more deposition processes, such as metal organic chemical vapor deposition (MOCVD) processes. Additionally or alternatively, forming the spacer layers can include one or more etch processes (e.g., chemical and/or other suitable etch processes), annealing processes, or other suitable manufacturing processes.

The method 900 can include, at 906, forming one or more amplification layers above the one or more waveguide layers. Forming the amplification layers can include, for example, forming at least one of an n-doped semiconductor layer, a multiple quantum wells (MQW) layer, a p-doped semiconductor layer, or an insulating layer. For instance, the amplification layers may be the layers 725-729 of FIG. 7B. Forming the amplification layers can include depositing material on the semiconductor wafer through one or more deposition processes, such as metal organic chemical vapor deposition (MOCVD) processes. Additionally or alternatively, forming the amplification layers can include one or more etch processes (e.g., chemical and/or other suitable etch processes), annealing processes, or other suitable manufacturing processes. As one example, the amplification layers can be formed by repeated deposition and etching to produce a "pyramid" configuration whereby the waveguide layers and the spacer layers have a greater width than the amplification layers.

Figure 10A:
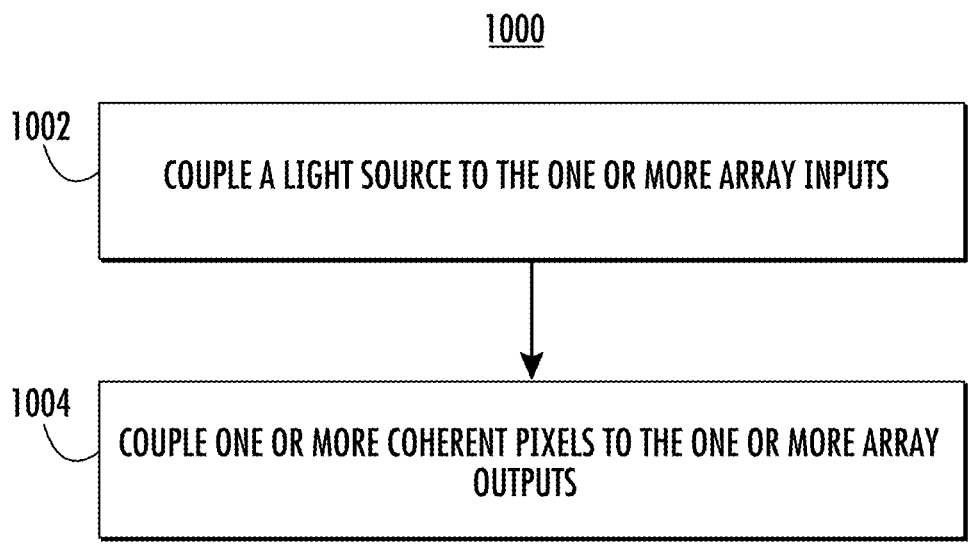

FIG. 10A depicts an example method 1000 for manufacturing a LIDAR system for a vehicle according to some implementations of the present disclosure. The steps of method 1000 may be incorporated into other methods disclosed herein as suitable, such as, for example, into method 800 of FIG. 8. For instance, the method 1000 may be performed with respect to a plurality of individualized SOA dies that are aligned with array inputs and array outputs, as in the method 800.

At 1002, the method 1000 can include coupling a light source to one or more array inputs. For instance, the method can include coupling the light source to the one or more array inputs by one or more intervening components, such as, but not limited to, one or more optical splitters, modulators, waveguides, or other suitable components of a LIDAR system.

At 1004, the method 1000 can include coupling one or more coherent pixels to the one or more array outputs. For instance, the coherent pixels can be configured to emit the light amplified by the individualized SOA dies into free space. Additionally or alternatively, the coherent pixels may receive the light from free space after it is reflected by an object in free space. A LIDAR system including the coherent pixels can derive information about the object in free space, such as its position, velocity, etc., by processing the reflected light.

Figure 10B:
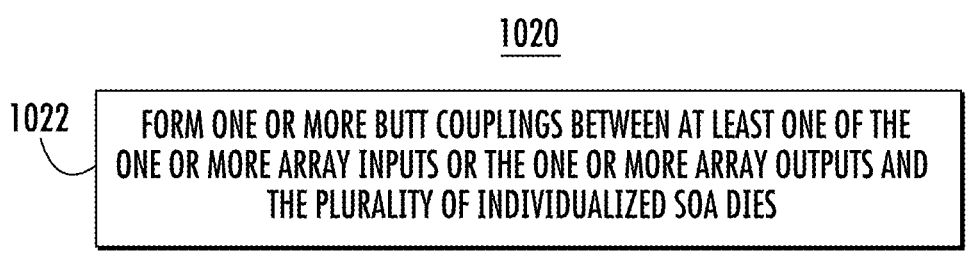

FIG. 10B depicts an example method 1020 for manufacturing a LIDAR system for a vehicle according to some implementations of the present disclosure. The steps of method 1020 may be incorporated into other methods disclosed herein as suitable, such as, for example, into method 800 of FIG. 8. For instance, the method 1020 may be performed with respect to a plurality of individualized SOA dies that are aligned with array inputs and array outputs, as in the method 800.

At 1022, the method 1020 can include forming one or more butt couplings between at least one of the one or more array inputs or the one or more array outputs and the plurality of individualized SOA dies. For instance, the butt couplings may be formed during alignment or as a separate step. The one or more butt couplings can be a direct coupling between a surface of the plurality of individualized SOA dies and the at least one of the one or more array inputs or the one or more array outputs. As one example, butt couplings may be formed at interfaces 342 or 344 of FIG. 3A.

Figure 10C:
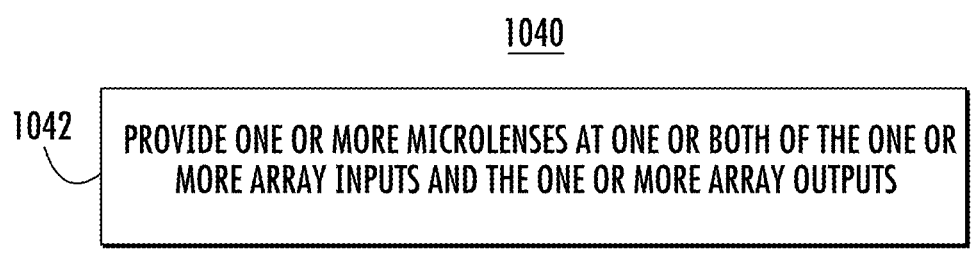

FIG. 10C depicts an example method 1040 for manufacturing a LIDAR system for a vehicle according to some implementations of the present disclosure. The steps of method 1040 may be incorporated into other methods disclosed herein as suitable, such as, for example, into method 800 of FIG. 8. For instance, the method 1040 may be performed with respect to a plurality of individualized SOA dies that are aligned with array inputs and array outputs, as in the method 800.

At 1042, the method 1040 can include providing one or more microlenses at one or both of the one or more array inputs and the one or more array outputs. The one or more microlenses can be configured to focus the beam passing through the plurality of individualized SOA dies. In some implementations, the microlenses may be provided during alignment or as a separate step. As one example, microlenses may be provided at interfaces 342 or 344 of FIG. 3A.

Aspects of the disclosure have been described in terms of illustrative implementations thereof. Numerous other implementations, modifications, or variations within the scope and spirit of the appended claims can occur to persons of ordinary skill in the art from a review of this disclosure. Any and all features in the following claims can be combined or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein, with "or" being understood as "and/or" unless otherwise indicated. Also, terms such as "based on" should be understood as "based at least in part on."

Those of ordinary skill in the art, using the disclosures provided herein, will understand that the elements of any of the claims, operations, or processes discussed herein can be adapted, rearranged, expanded, omitted, combined, or modified in various ways without deviating from the scope of the present disclosure. Some of the claims are described with a letter reference to a claim element for exemplary illustrated purposes and is not meant to be limiting. The letter references do not imply a particular order of operations. For instance, letter identifiers such as (a), (b), (c), . . . , (i), (ii), (iii), . . . , etc. can be used to illustrate operations. Such identifiers are provided for the ease of the reader and do not denote a particular order of steps or operations. An operation illustrated by a list identifier of (a), (i), etc. can be performed before, after, or in parallel with another operation illustrated by a list identifier of (b), (ii), etc.

The following describes the technology of this disclosure within the context of a LIDAR system and an autonomous vehicle for example purposes only. As described herein, the technology described herein is not limited to an autonomous vehicle and can be implemented for or within other systems, autonomous platforms, and other computing systems.

What is claimed is:

1. A method for manufacturing a semiconductor device for a LIDAR system for a vehicle, the method comprising:
   (a) forming a plurality of semiconductor optical amplifier (SOA) regions on a semiconductor wafer;
   (b) dicing the semiconductor wafer to produce a plurality of individualized SOA dies, the plurality of individualized SOA dies respectively comprising the plurality of SOA regions,
   (c) aligning the plurality of individualized SOA dies with one or more array inputs, the one or more array inputs configured to provide a beam from a light source to the plurality of individualized SOA dies;
   (d) aligning the plurality of individualized SOA dies with one or more array outputs, the one or more array outputs configured to provide the beam from the plurality of individual SOA dies to an emitter; and
   (e) coupling the plurality of individualized SOA dies to a thermally conductive substrate.

2. The method of claim 1, wherein dicing the semiconductor wafer produces a plurality of semiconductor dies respectively comprising the individualized SOA dies.

3. The method of claim 1, wherein (a) comprises:
   (i) forming one or more waveguide layers on the semiconductor wafer;
   (ii) forming one or more spacer layers between the one or more waveguide layers; and
   (iii) forming one or more amplification layers above the one or more waveguide layers.

4. The method of claim 3, wherein (iii) comprises forming at least one of an n-doped semiconductor layer, a multiple quantum wells (MQW) layer, a p-doped semiconductor layer, or an insulating layer.

5. The method of claim 3, wherein (i) comprises forming a waveguide region by the one or more waveguide layers for an individualized SOA die of the plurality of individualized SOA dies, the waveguide region comprising:
   a lateral portion defining an angle about 10 degrees of a lateral dimension of the individualized SOA die;
   a first angled portion extending from a first end of the lateral portion, the first angled portion defining an angle than about 10 degrees from the lateral dimension of the individualized SOA die; and
   a second angled portion extending from a second end of the lateral portion, the second angled portion defining an angle greater than about 10 degrees from the lateral dimension of the individualized SOA die.

6. The method of claim 5, wherein one of the first angled portion or the second angled portion defines an angle between about 10 degrees from the lateral dimension of the individualized SOA die and about 45 degrees from the lateral dimension of the individualized SOA die.

7. The method of claim 1, wherein at least one of (c) or (d) comprises aligning the plurality of individualized SOA dies along a first direction and a second direction.

8. The method of claim 1, wherein the thermally conductive substrate comprises a heat sink.

9. The method of claim 1, wherein the individualized SOA dies are aligned such that a lateral dimension of the individualized SOA dies is angled greater than about 10 degrees from a length dimension defined by the LIDAR system.

10. A method for manufacturing a LIDAR system for a vehicle, the method comprising:

(a) forming a plurality of semiconductor optical amplifier (SOA) regions on a semiconductor wafer;
(b) dicing the semiconductor wafer to produce a plurality of individualized SOA dies, the plurality of individualized SOA dies respectively comprising the plurality of SOA regions;
(c) aligning the plurality of individualized SOA dies with one or more array inputs;
(d) aligning the plurality of individualized SOA dies with one or more array outputs;
(e) coupling a light source to the one or more array inputs;
(f) coupling one or more coherent pixels to the one or more array outputs; and
(g) forming one or more butt couplings between at least one of the one or more array inputs or the one or more array outputs and the plurality of individualized SOA dies, the one or more butt couplings comprising a direct coupling between a surface of the plurality of individualized SOA dies and the at least one of the one or more array inputs or the one or more array outputs.

11. The method of claim 10, wherein (a) comprises:
(i) forming one or more waveguide layers on the semiconductor wafer;
(ii) forming one or more spacer layers between the one or more waveguide layers; and
(iii) forming one or more amplification layers above the one or more waveguide layers.

12. The method of claim 11, wherein (i) comprises forming a waveguide region by the one or more waveguide layers for an individualized SOA die of the plurality of individualized SOA dies, the waveguide region comprising:
a lateral portion defining an angle about 10 degrees of a lateral dimension of the individualized SOA die;
a first angled portion extending from a first end of the lateral portion, the first angled portion defining an angle than about 10 degrees from the lateral dimension of the individualized SOA die; and
a second angled portion extending from a second end of the lateral portion, the second angled portion defining an angle greater than about 10 degrees from the lateral dimension of the individualized SOA die.

13. A method for manufacturing a semiconductor device for a LIDAR system for a vehicle, the method comprising:
(a) forming a plurality of semiconductor optical amplifier (SOA) regions on a semiconductor wafer;
(b) dicing the semiconductor wafer to produce a plurality of individualized SOA dies, the plurality of individualized SOA dies respectively comprising the plurality of SOA regions;
(c) aligning the plurality of individualized SOA dies with one or more array inputs, the one or more array inputs configured to provide a beam from a light source to the plurality of individualized SOA dies;
(d) aligning the plurality of individualized SOA dies with one or more array outputs, the one or more array outputs configured to provide the beam from the plurality of individual SOA dies to an emitter; and
(e) providing one or more microlenses at one or both of the one or more array inputs and the one or more array outputs, the one or more microlenses configured to focus the beam passing through the plurality of individualized SOA dies.

14. The method of claim 13, wherein dicing the semiconductor wafer produces a plurality of semiconductor dies respectively comprising the individualized SOA dies.

15. The method of claim 13, wherein (a) comprises:
(i) forming one or more waveguide layers on the semiconductor wafer;
(ii) forming one or more spacer layers between the one or more waveguide layers; and
(iii) forming one or more amplification layers above the one or more waveguide layers.

16. The method of claim 15, wherein (iii) comprises forming at least one of an n-doped semiconductor layer, a multiple quantum wells (MQW) layer, a p-doped semiconductor layer, or an insulating layer.

17. The method of claim 15, wherein (i) comprises forming a waveguide region by the one or more waveguide layers for an individualized SOA die of the plurality of individualized SOA dies, the waveguide region comprising:
a lateral portion defining an angle about 10 degrees of a lateral dimension of the individualized SOA die;
a first angled portion extending from a first end of the lateral portion, the first angled portion defining an angle than about 10 degrees from the lateral dimension of the individualized SOA die; and
a second angled portion extending from a second end of the lateral portion, the second angled portion defining an angle greater than about 10 degrees from the lateral dimension of the individualized SOA die.

18. The method of claim 17, wherein one of the first angled portion or the second angled portion defines an angle between about 10 degrees from the lateral dimension of the individualized SOA die and about 45 degrees from the lateral dimension of the individualized SOA die.

19. The method of claim 13, wherein at least one of (c) or (d) comprises aligning the plurality of individualized SOA dies along a first direction and a second direction.

20. The method of claim 13, comprising:
(f) coupling the plurality of individualized SOA dies to a thermally conductive substrate.

* * * * *